United States Patent
Thyssen

(10) Patent No.: US 10,194,241 B2
(45) Date of Patent: Jan. 29, 2019

(54) SYSTEM AND METHOD FOR LOUDSPEAKER PROTECTION

(71) Applicant: Avago Technologies International Sales Pte. Limited, Singapore (SG)

(72) Inventor: Jes Thyssen, San Juan Capistrano, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/365,401

(22) Filed: Nov. 30, 2016

(65) Prior Publication Data

US 2017/0347190 A1 Nov. 30, 2017

Related U.S. Application Data

(60) Provisional application No. 62/343,517, filed on May 31, 2016, provisional application No. 62/415,026, (Continued)

(51) Int. Cl.
*H04R 3/00* (2006.01)
*G10L 21/0232* (2013.01)
(Continued)

(52) U.S. Cl.
CPC .......... *H04R 3/007* (2013.01); *G10L 21/0232* (2013.01); *H03G 3/3005* (2013.01); (Continued)

(58) Field of Classification Search
CPC .. H04R 3/007; H04R 29/001; H04R 2499/11; H04R 29/003; H04R 9/06
See application file for complete search history.

(56) References Cited

U.S. PATENT DOCUMENTS 9,065,412 B2  6/2015  Wu
9,800,734 B2  10/2017  Kechichian et al.
(Continued)

OTHER PUBLICATIONS

Bright, A., *Active Control of Loudspeakers: An Investigation of Practical Applications*, Ph.D. Thesis, Ørsted•DTU—Acoustic Technology, Technical University of Denmark, 2002, 203 pages.
(Continued)

*Primary Examiner* — Mohammad Islam
(74) *Attorney, Agent, or Firm* — Sterne, Kessler, Goldstein & Fox P.L.L.C.

(57) ABSTRACT

Systems, devices, and methods are described for providing loudspeaker protection. An upstream loudspeaker model estimation component receives sensed electrical characteristics of a loudspeaker and generates an impedance model from which an excursion model, and associated parameters, of the loudspeaker as well as a gain change parameter may be generated. The impedance components are fitted to features of an estimated impedance, based on the voltage and current sense data, to generate the estimated impedance model that is converted to an excursion model of the loudspeaker. A downstream audio signal processing component, based on the excursion model, or parameters thereof, limits a predicted excursion of the loudspeaker utilizing excursion-constraining processing circuitry that includes a non-linear constraint filter. Processed audio signals associated with the limited excursion are subject to distortion suppression prior to releasing the output audio signals for playback on the loudspeaker.

20 Claims, 6 Drawing Sheets

Related U.S. Application Data filed on Oct. 31, 2016, provisional application No. 62/423,533, filed on Nov. 17, 2016, provisional application No. 62/423,292, filed on Nov. 17, 2016.

(51) Int. Cl.

| | | |
|---|---|---|
| *H04R 29/00* | (2006.01) | |
| *H03G 3/30* | (2006.01) | |
| *H04R 3/04* | (2006.01) | |
| *H04R 9/06* | (2006.01) | |

(52) U.S. Cl.
CPC .............. *H04R 3/04* (2013.01); *H04R 29/001* (2013.01); *H04R 29/003* (2013.01); *H04R 9/06* (2013.01); *H04R 2499/11* (2013.01)

(56) References Cited

U.S. PATENT DOCUMENTS

| | | | | |
|---|---|---|---|---|
| 9,837,971 | B2* | 12/2017 | Luo | H03F 1/52 |
| 2005/0175196 | A1 | 8/2005 | Chen | |
| 2010/0215193 | A1 | 8/2010 | Wihardja et al. | |
| 2011/0178800 | A1 | 7/2011 | Watts | |
| 2011/0228945 | A1* | 9/2011 | Mihelich | H04R 3/002 |
| | | | | 381/59 |
| 2012/0281844 | A1* | 11/2012 | Luo | H03F 1/52 |
| | | | | 381/55 |
| 2015/0003606 | A1 | 1/2015 | Nemer | |
| 2015/0304772 | A1* | 10/2015 | Risberg | H04R 3/002 |
| | | | | 381/55 |
| 2015/0304775 | A1 | 10/2015 | Fujita | |
| 2016/0192070 | A1* | 6/2016 | Bjoern-Josefsen | H04R 3/007 |
| | | | | 381/55 |
| 2016/0241960 | A1* | 8/2016 | Cheng | H04R 29/001 |
| 2017/0318388 | A1* | 11/2017 | Risberg | H04R 3/002 |
| 2017/0318390 | A1 | 11/2017 | Bjork et al. | |
| 2017/0345438 | A1 | 11/2017 | Thyssen | |
| 2017/0347188 | A1 | 11/2017 | Thyssen | |
| 2017/0347189 | A1 | 11/2017 | Thyssen | |
| 2017/0347190 | A1* | 11/2017 | Thyssen | H04R 3/007 |
| 2017/0347199 | A1 | 11/2017 | Mao et al. | |

OTHER PUBLICATIONS

Bright, A., "Discrete-time loudspeaker modelling," *Audio Engineering Society 114th Convention*, Amsterdam, The Netherlands, Mar. 22-25, 2003, 25 pages.

Henderson, H.V. and Searle, S.R., "On Deriving the Inverse of a Sum of Matrices," *Paper No. BU-647-M in the Biometrics Unit Series*, Jan. 1980, 21 pages.

Johnson, C.R., Jr., "Adaptive IIR filtering: Current Results and Open Issues," *IEEE Transactions on Information Theory*, vol. IT-30, No. 2, Mar. 1984, pp. 237-250.

Klippel, W., "Assessment of Voice-Coil Peak Displacement Xmax," *Journal of Audio Engineering Society*, vol. 51, No. 5, May 2003, 15 pages.

Klippel, W. and Seidel, U., "Fast and Accurate Measurement of Linear Transducer Parameters," *Audio Engineering Society 110th Convention*, Amsterdam, The Netherlands, May 12-15, 2001, 8 pages.

Klippel, W., "Large Signal Performance of Tweeters, Micro Speakers, and Horn Drivers," *Audio Engineering Society 118th Convention*, May 2005, 18 Pages.

Klippel, W., "Measurement of Large-Signal Parameters of Electrodynamic Transducer", *Audio Engineering Society 107th Convention*, New York, Sep. 24-27, 1999, 22 Pages.

Klippel, W., "Nonlinear losses in electro-acoustical transducers," *Proceedings of the Acoustics 2012 Nantes Conference*, Nantes, France, Apr. 23-27, 2012, pp. 3483-3488.

Klippel, W. et al., "The power of Loudspeaker Models," Workshop at Audio Engineering Society 117th Convention, San Francisco, Oct. 28-31, 2004, 50 Pages.

Klippel, W., "Tutorial: Loudspeaker Nonlinearities—Causes, Parameters, Symptoms," *Journal of the Audio Engineering Society*, vol. 54, No. 10, Oct. 2006, pp. 907-939.

Knudsen, M.H. et al., "Determination of Loudspeaker Driver Parameters Using a System Identification Technique," *Journal of the Audio Engineering Society*, vol. 37, No. 9, Sep. 1989, pp. 700-708.

Luo, C. et al., "A Model Based Excursion Protection Algorithm for Loudspeakers," *Proceedings ICASSP*, 2012, pp. 233-236.

Shynk, J.J., "Adaptive IIR Filtering", *IEEE ASSP Magazine*, Apr. 1989, pp. 4-21.

\* cited by examiner

SYSTEM AND METHOD FOR LOUDSPEAKER PROTECTION

CROSS-REFERENCE TO RELATED APPLICATIONS

The instant application claims priority to each of: U.S. Provisional Patent Application No. 62/423,292, entitled "System and Method for Loudspeaker Protection," filed on Nov. 17, 2016, U.S. Provisional Patent Application No. 62/343,517, entitled "System and Method for Loudspeaker Protection," filed on May 31, 2016, U.S. Provisional Patent Application No. 62/415,026, entitled "System and Method for Loudspeaker Protection," filed on Oct. 31, 2016, and U.S. Provisional Patent Application No. 62/423,533, entitled "System and Method for Loudspeaker Protection," filed on Nov. 17, 2016, the entirety of each of which is incorporated herein by reference.

BACKGROUND

I. Technical Field

Embodiments described herein relate to protection of loudspeakers during operation.

II. Background Art

Devices, such as personal computers and laptops, cellular and smart phones, wireless device accessories, headsets, personal digital assistants (PDAs), portable music players, handheld gaming devices, home electronics and entertainment devices, televisions, stand-alone loudspeaker units, etc., include loudspeakers, such as microspeakers, for reproduction or playback of an audio signal. Loudspeakers may suffer damage and/or failures from extended high-stress use and over-excursion scenarios. For example, extended use at high audio volume levels and/or in high temperatures can cause breakdowns by melting the adhesives used to attach the voice coils in loudspeakers. High audio volume levels can also cause diaphragms of speakers to travel (i.e., undergo an excursion) beyond their mechanical capabilities resulting in permanent damage to the suspension of the loudspeaker. Existing solutions use linear filtering to constrain the amplitude of audio signals to mediate excursions based on a loudspeaker model. This constraint processing may introduce distortion into audio signals or excessively lower the perceived loudness of the audio signal.

BRIEF SUMMARY

Methods, systems, and apparatuses are described for loudspeaker protection, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1A:
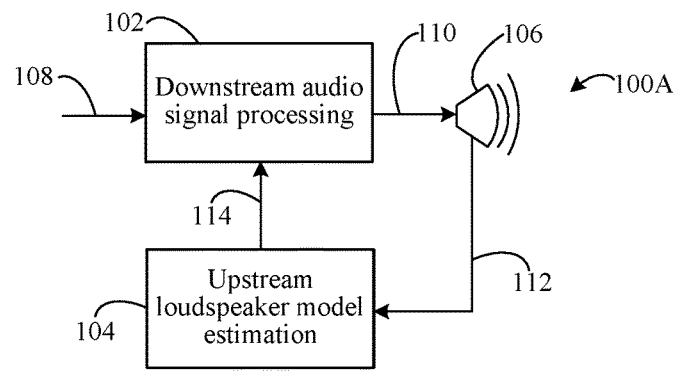
FIG. 1A shows a block diagram of a loudspeaker protection system, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Embodiments

The example techniques and embodiments described herein may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers, such as but not limited to microspeakers. While the embodiments herein may be described with respect to microspeakers as conceptual and/or illustrative examples for descriptive consistency, other types of loudspeakers are also contemplated for implementing the disclosed techniques. It is contemplated herein that in various embodiments and with respect to the illustrated figures of this disclosure, one or more components described and/or shown may not be included and that additional components may be included.

The techniques described herein provide novel loudspeaker protection systems, methods, and devices, such as in devices with loudspeakers, e.g., microspeakers, etc. The described techniques and embodiments provide for efficient, robust loudspeaker protection using upstream loudspeaker model estimation and downstream audio signal processing. For example, a loudspeaker protection system may include an upstream loudspeaker model estimation component and a downstream audio signal processing component.

An upstream loudspeaker model estimation component of an audio protection system according to embodiments is configured to provide component-based impedance model fitting of electrical characteristics of operating loudspeakers. That is, current and voltage characteristics of an operating loudspeaker may be sensed (e.g., during playback of general audio) to generate an impedance estimation. From this estimation, different impedance components, which comprise one or more respective impedance parameters, may be individually fit into an impedance model. Furthermore, some loudspeaker enclosures result in a secondary resonance which can also be reliably fit into the impedance model. In embodiments, separate excursion model conversion (to model excursions of operating loudspeakers) is provided by upstream loudspeaker model estimation components based on the impedance model. The described upstream loudspeaker model estimation components also seamlessly incorporate temperature prediction and corresponding gain modifiers into the loudspeaker protection systems herein.

A downstream audio signal processing component of an audio protection system according to embodiments is configured to utilize the gain modifiers generated by the upstream loudspeaker model estimation component to process an audio signal, e.g., reducing gain, to lower voice coil temperature to within acceptable operational ranges. A downstream audio signal processing component is also configured to perform signal processing to constrain loudspeaker excursion. The signal processing operates to constrain or limit, e.g., a diaphragm or cone excursion of a loudspeaker. The signal processing circuitry limits predicted excursions corresponding to audio signals using a non-linear constraint filter, which includes a limiter, and is based on the excursion model. The limiting is performed by processing the corresponding audio signals such that the resulting excursion is constrained using the non-linear constraint filter. The non-linear constraint filter includes an integral feed-back portion (i.e., inverse excursion model). The audio signals corresponding to the limited predicted excursion provide for the desired constrained excursions when a predicted excursion would exceed mechanical limitations. Limiting the excursion of the diaphragm of the loudspeaker mitigates, or eliminates, loudspeaker damage or failure due to the loudspeaker diaphragm traveling beyond its mechanical limits. Parameters for the excursion model (or the model itself) are received from the upstream estimation component, and are inserted in the non-linear constraint filter circuitry where the predicted excursion is constrained by the processing of the audio signal.

Processing techniques also provide for distortion suppression to suppress unwanted distortion introduced by the non-linear constraint filter on a frequency bin basis. An unwanted distortion may be one that creates an objectionable listening experience for a listener or user of the device. In embodiments, unwanted distortion may be based on one or more types of distortion meeting or exceeding a threshold. While diaphragm excursions are referred to herein, it is also contemplated that other excursions associated with loudspeakers, e.g., cone excursions, are contemplated herein, and the described techniques and embodiments are applicable thereto.

FIG. 1A shows a block diagram of a loudspeaker protection system 100A, according to an embodiment. Loudspeaker protection system 100A includes a downstream audio signal processing component 102 and an upstream loudspeaker model estimation component 104. Downstream audio signal processing component 102 and upstream loudspeaker model estimation component 104 may perform functions as described above. Upstream loudspeaker model estimation component 104 is configured to receive sensed electrical characteristics, or indicia thereof, of a loudspeaker 106 via a connector 112 when loudspeaker 106 is operating, i.e., reproducing audio sounds. Upstream loudspeaker model estimation component 104 is configured to generate an excursion model and a gain modifier for providing to downstream audio signal processing component 102 via a connector 114. Downstream audio signal processing component 102 is configured to receive an audio signal via a connector 108 and perform audio signal processing according to the excursion model and/or gain modifier, in embodiments, and is configured to perform distortion suppression of audio signals, in embodiments, for audio signal outputs provided for playback by loudspeaker 106 via a connector 110.

In embodiments, upstream loudspeaker model estimation component 104 does not perform processing of audio signals, while downstream audio signal processing component 102 performs all audio signal processing. Additionally, upstream loudspeaker model estimation component 104 is configured to update and provide the excursion model and the gain modifier to downstream audio signal processing component 102 asynchronously with respect to the operation of downstream audio signal processing component 102, e.g. the downstream processing component 102 may be block based, for instance, with a 10 ms frame, i.e., a frame-rate of 1 frame per 10 ms, while the upstream component 104 provides parameters to the downstream processing component less frequently or at a slower rate, but typically on a downstream frame boundary. Upstream loudspeaker model estimation component 104 and downstream audio signal processing component 102 may be implemented in hardware, firmware, software, or any combination thereof. In one embodiment, downstream audio signal processing component 102 is implemented as electrical hardware and upstream loudspeaker model estimation component 104 is implemented as a combination of hardware, firmware, and software.

As noted above, loudspeaker protection system 100A may be adapted to various types of systems and devices, for example but without limitation, personal computers and laptops, communication devices (e.g., cellular and smart phones), wireless device accessories, headsets, personal digital assistants (PDAs), portable music players, handheld gaming devices and gaming consoles, televisions, stand-alone loudspeaker units, and/or the like, that include loudspeakers. It should be understood that the connections described above may comprise one or more connections that are related to or separate from each other. Further embodiments and details relating to loudspeaker protection systems, downstream audio signal processing component 102, and upstream loudspeaker model estimation component 104 are described elsewhere herein.

Figure 1B:
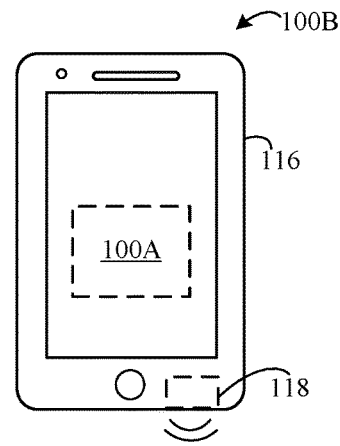
FIG. 1B shows a device that includes the loudspeaker protection system of FIG. 1A, according to an example embodiment.

FIG. 1B shows a device 100B that includes loudspeaker protection system 100A of FIG. 1A, according to an embodiment. While device 100B is shown as a smartphone, other types of devices described herein are also contemplated according to embodiments. Device 100B includes a base structure 116. Base structure 116 includes buttons and/or other types of user interfaces, cameras, and microphones, as well as processing and communication circuitry, memory, and/or the like, commonly found in smartphones as would be understood by one of skill in the relevant art(s) having the benefit of this disclosure. Base structure 116 may also include an enclosure 118 having an aperture through which sound of a loudspeaker (e.g., loudspeaker 106 of FIG. 1A) is emitted. Enclosure 118 may encompass or substantially encompass the loudspeaker, and may result in a secondary resonance during operation of the loudspeaker.

Referring back to FIG. 1A, loudspeaker 106 may be any type of loudspeaker, such as a microspeaker (a thin electro-dynamic loudspeaker), and more than one loudspeaker may be included in a device, according to embodiments. In such embodiments, the embodiments and techniques described herein may be applied to one or more loudspeakers of a device.

Figure 1C:
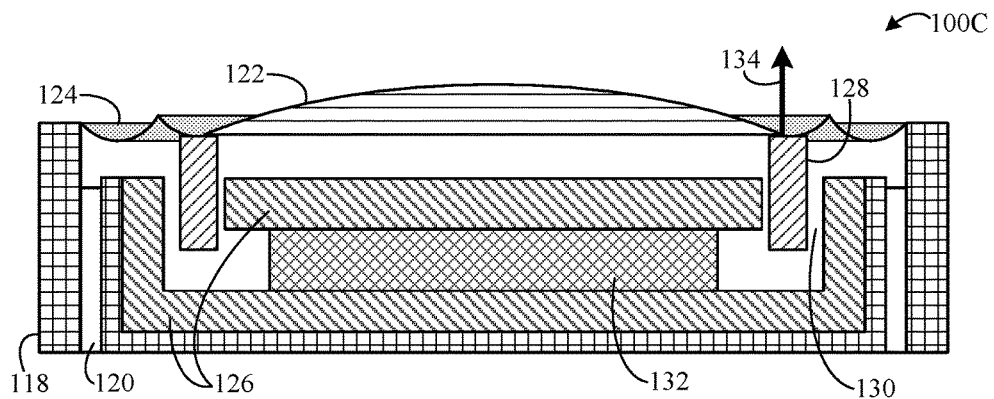
FIG. 1C shows a diagram of a cross-section of a microspeaker, according to an example embodiment.

Turning now to FIG. 1C, a diagram of a cross-section of a microspeaker 100C is shown, according to an embodiment. Microspeaker 100C may be a further embodiment of loudspeaker 106 of FIG. 1A, and may be included in enclosure 118 of FIG. 1B in embodiments. Microspeaker 100C includes a frame 118 having one or more ventilation passages 120. Frame 118 supports magnetic circuits 126 and a suspension 124, and a magnet 132 is included between magnetic circuits 126, e.g., as shown in FIG. 1C. A voice coil 128 is attached via adhesive to a diaphragm 122. A magnetic field is applied in a gap 130 between voice coil 128 and magnetic circuits 126 resulting in voice coil 128 exerting a force $f_x$ on diaphragm 122 causing diaphragm 122 to travel a distance $x_d$ (i.e., an excursion or displacement). The force $f_x$ and the distance $x_d$ are denoted as a vector 134. The magnitude of $f_x$ and length of $x_d$ correlate to the magnetic field and its associated voltage of an audio signal being played back by microspeaker 100C. If excessive force is applied as $f_x$, or applied for an extended period of time, diaphragm 122 of microspeaker 100C may travel beyond its mechanical limits (i.e., an excursion with a distance $x_d$) resulting in damage or failure of microspeaker 100C. Furthermore, adhesives used to attach voice coil 128 to diaphragm 122 and/or suspension 124 may slowly break down or melt with rising temperatures of voice coil 128. Accordingly, the techniques and embodiments described herein provide for improvements in the protection of loudspeakers as described above, including but not limited to microspeakers.

For instance, methods, systems, devices, and apparatuses are provided for improved loudspeaker protection. A loudspeaker protection system comprising an audio signal processing component in accordance with an example aspect is described. The first audio signal processing circuitry comprises a non-linear constraint filter. The non-linear constraint filter is configured to receive an audio signal and receive one or more parameters of an excursion model of a loudspeaker from a model estimation component. The non-linear constraint filter is also configured to generate a processed version of the audio signal corresponding to a constrained predicted excursion based on the excursion model.

A method in loudspeaker protection system in accordance with another example aspect is described. The method includes receiving an audio signal by first audio signal processing circuitry comprising a non-linear constraint filter, and receiving one or more parameters of an excursion model of a loudspeaker by the first audio signal processing circuitry from a model estimation component. The method also includes generating a processed version of the audio signal corresponding to a constrained predicted excursion based on the excursion model.

A computer readable storage device in accordance with yet another example aspect is also described. The computer readable storage device comprises a storage medium encoded with program instructions that, when executed by a computing device, cause the computing device to perform a method for loudspeaker protection based on processing of an audio signal. The program instructions include first instructions for receiving an audio signal, and second instructions for receiving one or more parameters of an excursion model of a loudspeaker from a model estimation component. The program instructions further include third instructions for generating a processed version of the audio signal corresponding to a constrained predicted excursion based on the excursion model using a non-linear constraint filter.

Various example embodiments are described in the following subsections. In particular, example upstream loudspeaker model estimation embodiments are described. This description is followed by downstream audio signal processing embodiments. Next, further example embodiments and advantages are described, and subsequently an example computing device implementation is described. Finally, some concluding remarks are provided. It is noted that the division of the following description generally into subsections is provided for ease of illustration, and it is to be understood that any type of embodiment may be described in any subsection.

III. Example Upstream Loudspeaker Model Estimation Embodiments

As noted above, systems for protection of loudspeakers, such as microspeakers, along with their components such as upstream loudspeaker model estimation components, may be configured in various ways to provide loudspeaker protection.

In embodiments, by way of illustrative example and not limitation, an upstream loudspeaker model estimation component comprises one or more subcomponents configured to fit parameters of an impedance model of a loudspeaker during operation, generate an excursion model, predict a temperature of a voice coil of the loudspeaker, and generate a gain change parameter. These functions of the upstream loudspeaker model estimation component may be based, at least in part, on sensed electrical characteristics, or indicia thereof, of the loudspeaker during its operation.

Figure 2:
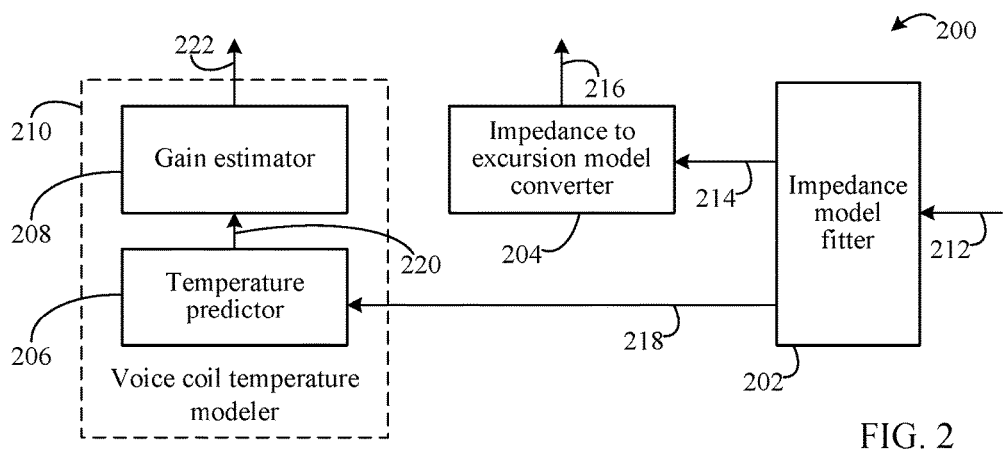
FIG. 2 shows a block diagram of an upstream loudspeaker model estimation component of a loudspeaker protection system, according to an example embodiment.
Figure 3:
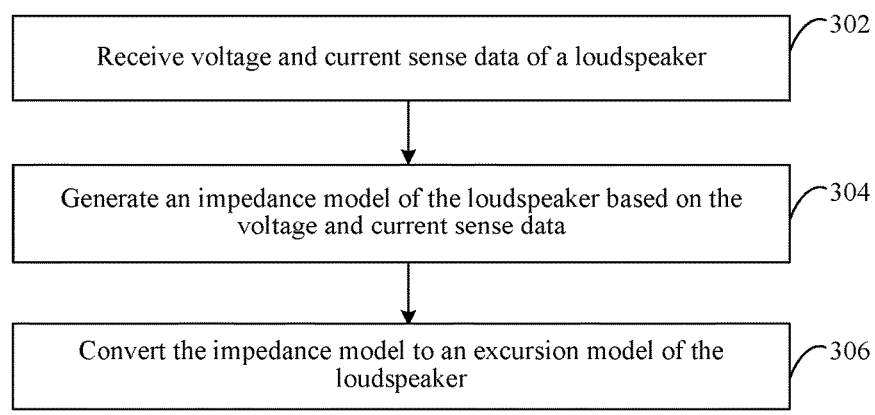
FIG. 3 shows a flowchart for model generation by the upstream loudspeaker model estimation component of FIG. 2, according to an example embodiment.

FIG. 2 shows a block diagram of an upstream loudspeaker model estimation component 200 of a loudspeaker protection system, according to an embodiment. Upstream loudspeaker model estimation component 200 may be a further embodiment of upstream loudspeaker model estimation component 104 of FIG. 1A. Upstream loudspeaker model estimation component 200 includes an impedance model fitter 202, an impedance to excursion model converter 204, a temperature predictor 206, and a gain estimator 208. In embodiments, temperature predictor 206 and gain estimator 208 may together comprise a voice coil temperature modeler 210.

Impedance model fitter 202 is configured to receive voltage and current sense data for a loudspeaker and/or a voice coil thereof, such as loudspeaker 106 of FIG. 1A, via a connector 212 from a voltage sensor and a current sensor (not shown) electrically coupled to the loudspeaker. The received voltage and current sense data are operational data sensed during operation of the loudspeaker, e.g., during playback of audio, according to embodiments, and may be voltage and current sense data of a voice coil of the loudspeaker. In embodiments, indicia of the voltage and current sense data may be received.

Impedance model fitter 202 is configured to generate the impedance model of the loudspeaker based on the voltage and current sense data. That is, based on the received sense data, or indicia, an impedance estimate in the Laplace domain may be generated, e.g., according to impedance 'Z' being equal to voltage 'U' divided by current 'I' as a function of frequency:

$$U(s)=I(s)Z(s), \quad \text{(Eq. 1)}$$

solving for Z, $$|Z(s)| = \frac{|U(s)|}{|I(s)|}. \quad \text{(Eq. 2)}$$

The impedance model may include one or more components (or impedance components) such as resistivity, inductance, primary resonance, and secondary resonance. The parameters of the components are estimated by fitting the impedance model to the impedance estimate (the observed impedance of the loudspeaker calculated from the sensed voltage and current during general audio playback).

Impedance to excursion model converter 204 is configured to convert the impedance model to an excursion model of the loudspeaker. Impedance to excursion model converter 204 is configured to receive the impedance model from impedance model fitter 202, via a connector 214, and to generate the excursion model based on the conversion of one or more components of the impedance model, and a force factor 'ϕ' of the loudspeaker that may be provided by a manufacturer or derived from operation of the loudspeaker. In embodiments, the excursion model may be generated by conversion with or without taking the secondary resonance component into account.

The excursion model generated by conversion at impedance to excursion model converter 204 may be provided via a connector 216 to downstream processing circuitry or a downstream processing component, such as in downstream audio signal processing component 102 of FIG. 1A for use in the processing of audio signals.

For instance, impedance model fitter 202 may include an impedance estimator, a component fitting elements for resistivity, inductance, primary resonance, and resonance component. Impedance model fitter 202 may also be configured to determine or generate lumped parameters in some configurations. Impedance model fitter 202 may be configured to receive voltage sense data and current sense data for a loudspeaker and/or a voice coil thereof, such as loudspeaker 106 of FIG. 1A. Voltage sense data and current sense data may be received from a voltage sensor and a current sensor (not shown) electrically coupled to the loudspeaker. The received voltage sense data and current sense data are operational data sensed during operation of the loudspeaker, e.g., during playback of audio, according to embodiments, and may be sensed voltage and current data of a voice coil of the loudspeaker, e.g., as illustrated in FIG. 1C. In embodiments, indicia of the voltage sense data and current sense data may be received. The impedance estimator is configured to receive frequency domain signals representative of the voltage sense data and the current sense data respectively, and to estimate the impedance of the loudspeaker according to Equations 1 & 2 described above. The resulting impedance estimate Z(s), voltage U(s) divided by current I(s), may include one or more impedance components as also described above: resistivity 'R', inductance 'Ls', primary resonance, and/or secondary resonance. Each of these components may include one or more associated parameters. Based on the estimated impedance Z(s), the impedance estimator is configured to estimate the impedance components and the associated parameters for the impedance components.

As shown in the Laplace domain, the transform of the voltage U(s) may be represented as a sum of the resistivity multiplied by the transform of the current I(s), the inductance multiplied by the transform of the current I(s) and 's', and a transform of the cone excursion 'X(s)' multiplied by 's' that is modified by ϕ (i.e., a force factor, power factor, or induction factor of the loudspeaker, hereinafter "force factor"), as shown below in Equation 3. The differential equation related to electrical side of the loudspeaker, governing the behavior, is:

$$U(s)=RI(s)+LsI(s)+\phi sX(s). \quad \text{(Eq. 3)}$$

This can be combined with an observed electrical impedance:

$$Z(s)=Z_1(s)+Z_2(s)Z_3(s)Z_6(s), \quad \text{(Eq. 4)}$$

with the impedance components, comprising one or more impedance parameters, being:

$Z_1(s) = R$ (voice coil resistivity), $Z_2(s) = Ls$ (voice coil inductance), $Z_3(s) = \dfrac{s\phi^2}{ms^2 + rs + \dfrac{1}{c}}$ (primary resonance (mechanical)), and $Z_6(s) = \dfrac{s}{C_6 s^2 + \dfrac{1}{R_6}s + \dfrac{1}{L_6}}$ (secondary resonance), to form the voice coil voltage to cone excursion that takes the secondary resonance in the impedance into account, where for $Z_3(s)$, the parameter 'm' is the mass of the moving loudspeaker system, the parameter 'r' is the mechanical resistance of the loudspeaker driver suspension, and the parameter 'c' is the compliance of driver suspension (1/k or 1/mechanical-stiffness), and for the electrical equivalent of $Z_6(s)$, capacitor '$C_6$', resistor '$R_6$', and inductor in parallel as lumped parameters, are:

$$C_6 = m_2/\phi_2^2,\ R_6 = \phi_2^2/r_2,\ \text{and}\ L_6 = c_2\phi_2^2 = \phi_2^2/k_2.$$

The parameters of $Z_6(s)$, the secondary resonance component, may be denoted with a subscript of '2' for clarity and naming convention purposes.

The voice coil voltage to cone excursion transform may be represented as:

$$U(s) = (Z_1(s) + Z_2(s))\dfrac{U(s)}{Z(s)} + \phi s X(s) \Leftrightarrow U(s)\left(1 - \dfrac{Z_1(s) + Z_2(s)}{Z(s)}\right) = \quad \text{(Eq. 5)}$$

$$\phi s X(s) \Leftrightarrow \dfrac{X(s)}{U(s)} = \dfrac{1}{\phi(s)} \dfrac{Z_3(s) + Z_6(s)}{Z_1(s) + Z_2(s) + Z_3(s) + Z_6(s)}.$$

The secondary resonance may be a result of the specific acoustic design of a loudspeaker enclosure with acoustic radiation through a narrowing "port". It should be noted that if consideration to the secondary resonance is desirable, then the term representing it can likely be fixed as it reflects physical dimensions of the enclosure which are not subject to change due to manufacturing variations, temperature, or other environmental factors.

The voice coil resistivity R provides the general level of the impedance and dominates the impedance at low frequencies $Z_{LF}$. Hence, the resistivity R can be found as the impedance at low frequencies by:

$$|Z_{LF}|(\omega)| = R, \quad \text{(Eq. 6)}$$

The voice coil inductance Ls results in an upward linear slope of the impedance estimate, dominating the overall impedance at higher frequencies $Z_{HF}$. As can be seen from the expression of $Z_2(s)$, the value of the inductance is equal to the slope. Disregarding eddy currents and using a simplified voice coil inductance model, at higher frequencies the magnitude of the impedance is dominated by:

$$|Z_{HF}(\omega)| = |R + j\omega L|, \quad \text{(Eq. 7)}$$

where R is a non-negligible contribution when the voice coil inductance Ls is small. Using a sum of squared error of squared magnitude of impedance over a frequency range for the cost function, the derivate with respect to the voice coil inductance Ls and resistivity R is derived to:

$$L = \sqrt{\dfrac{\sum\limits_\omega (|Z(\omega)|^2 - R^2)\omega^2}{\sum\limits_\omega \omega^4}}, \quad \text{(Eq. 8)}$$

for voice coil inductance calculated from the first non-trivial solution, or for a joint optimal solution:

$$L = \sqrt{\dfrac{\left(\sum\limits_\omega |Z(\omega)|^2 \omega^2\right)\left(\sum\limits_\omega 1\right) - \left(\sum\limits_\omega \omega^2\right)\left(\sum\limits_\omega |Z(\omega)|^2\right)}{\left(\sum\limits_\omega \omega^4\right)\left(\sum\limits_\omega 1\right) - \left(\sum\limits_\omega \omega^2\right)^2}}, \quad \text{(Eq. 9)}$$

and $$R = \sqrt{\dfrac{\sum\limits_\omega |Z(\omega)|^2 - L^2 \sum\limits_\omega \omega^2}{\sum\limits_\omega 1}}. \quad \text{(Eq. 10)}$$

The mechanical primary resonance impedance component ($Z_3(s)$ as in the description of Equation 4) is responsible for the primary resonance appearing at lower frequencies of the impedance estimate. The impedance of loudspeaker and enclosure designs for smartphones and other smaller handheld devices typically have their primary resonance in lower frequency ranges (e.g., at or around 1 kHz). Primary resonance impedance component $Z_3(s)$ has a resonance frequency where the square of the magnitude of the numerator has a minimum. The magnitude of the numerator is given by:

$$\dfrac{1}{|Z_3(s = j\omega)|^2} = \left|\dfrac{m}{\phi^2}j\omega + \dfrac{r}{\phi^2} + \dfrac{1}{\phi^2 c j\omega}\right|^2 = \quad \text{(Eq. 11)}$$

$$\left|\dfrac{m}{\phi^2}j\omega + \dfrac{r}{\phi^2} - \dfrac{1}{\phi^2 c \omega}j\right|^2 = \left(\dfrac{m}{\phi^2}\omega - \dfrac{1}{\phi^2 c \omega}\right)^2 + \left(\dfrac{r}{\phi^2}\right)^2,$$

which, through the derivative with respect to frequency, yields the primary resonance frequency at:

$$\omega_s = \dfrac{1}{\sqrt{mc}}. \quad \text{(Eq. 12)}$$

Although the primary resonance frequency may be determined by $Z_3(s)$ alone, the absolute impedance at the resonance frequency is determined by $Z_1(s) + Z_3(s)$, assuming that the contribution of the inductance and a possible secondary resonance is negligible at low frequency.

$$Z_s = \left|Z_1\left(s = j\dfrac{1}{\sqrt{mc}}\right) + Z_3\left(s = j\dfrac{1}{\sqrt{mc}}\right)\right| = \quad \text{(Eq. 13)}$$

$$\left|R + \dfrac{1}{j\dfrac{m1}{\phi^2\sqrt{mc}} + \dfrac{r}{\phi^2} - j\dfrac{\sqrt{mc}}{\phi^2 c}}\right| = R + \dfrac{\phi^2}{r}.$$

The two frequencies where the impedance has decreased from its primary resonance value given above to:

$$Z_M = |Z_1(\omega_{L/H}) + Z_3(\omega_{L/H})| = \sqrt{RZ_s}. \quad \text{(Eq. 14)}$$

are denoted $\omega_L$ and $\omega_H$, respectively, and determined from:

$$|Z_1(\omega) + Z_3(\omega)| = \left| R + \frac{1}{j\frac{m}{\phi^2}\omega + \frac{r}{\phi^2} - j\frac{1}{\phi^2 c\omega}} \right| = \quad \text{(Eq. 15)}$$

$$\left| R + \frac{1}{\frac{1}{Z_s - R} + j\left(\frac{m}{\phi^2}\omega - \frac{1}{\phi^2 c\omega}\right)} \right| =$$

$$\sqrt{\frac{(\phi^2 c\omega Z_s)^2 + (Z_s - R)^2 R^2\left(\left(\frac{\omega}{\omega_s}\right)^2 - 1\right)^2}{(\phi^2 c\omega)^2 + (Z_s - R)^2\left(\left(\frac{\omega}{\omega_s}\right)^2 - 1\right)^2}}.$$

Inserting $\omega_L$ and $\omega_H$ and imposing the constraint leads to the following two equations:

$$\frac{(\phi^2 c\omega_L Z_s)^2 + (Z_s - R)^2 R^2\left(\left(\frac{\omega_L}{\omega_s}\right)^2 - 1\right)^2}{(\phi^2 c\omega_L)^2 + (Z_s - R)^2 R^2\left(\left(\frac{\omega_L}{\omega_s}\right)^2 - 1\right)^2} = RZ_s. \quad \text{(Eq. 16)}$$

$$\frac{(\phi^2 c\omega_H Z_s)^2 + (Z_s - R)^2 R^2\left(\left(\frac{\omega_H}{\omega_s}\right)^2 - 1\right)^2}{(\phi^2 c\omega_H)^2 + (Z_s - R)^2 R^2\left(\left(\frac{\omega_H}{\omega_s}\right)^2 - 1\right)^2} = RZ_s. \quad \text{(Eq. 17)}$$

Based on these known parameters and the two equations above, it appears that the force-factor and the effective compliance of the driver suspension can be calculated from:

$$\phi^2 c = |Z_s - R|\frac{1}{\omega_s^2}\left|\omega_L - \frac{\omega_s^2}{\omega_L}\right|\sqrt{\frac{(RZ_s - R^2)}{(Z_s^2 - RZ_s)}} = \quad \text{(Eq. 18)}$$

$$|Z_s - R|\frac{1}{\omega_s^2}\left|\omega_L - \frac{\omega_s^2}{\omega_L}\right|\sqrt{\frac{R}{Z_s}},$$

and $$\phi^2 c = |Z_s - R|\frac{1}{\omega_s^2}\left|\omega_H - \frac{\omega_s^2}{\omega_H}\right|\sqrt{\frac{(RZ_s - R^2)}{(Z_s^2 - RZ_s)}} = \quad \text{(Eq. 19)}$$

$$|Z_s - R|\frac{1}{\omega_s^2}\left|\omega_H - \frac{\omega_s^2}{\omega_H}\right|\sqrt{\frac{R}{Z_s}}.$$

However, since $\omega_s = \sqrt{\omega_L \omega_H}$ the two right-hand sides become identical:

$$\left|\omega_H - \frac{\omega_s^2}{\omega_H}\right| = \left|\frac{\omega_s^2}{\omega_L} - \frac{\omega_L \omega_s^2}{\omega_s^2}\right| = \left|-\left(\omega_L - \frac{\omega_s^2}{\omega_L}\right)\right| = \left|\left(\omega_L - \frac{\omega_s^2}{\omega_L}\right)\right| q.e.d \quad \text{(Eq. 20)}$$

Intuitively, this also makes sense, as ($\phi^2 c$) cannot take on two different results.

If the (equivalent) mass is known then the parameters can be calculated according to:

$$c = \frac{1}{\omega_s^2 m}, \phi^2 = m|Z_s - R|\left|\omega_H - \frac{\omega_s^2}{\omega_H}\right|\sqrt{\frac{R}{Z_s}}, \text{ and}$$

$$r = \frac{\phi^2}{Z_s - R} = m\left|\omega_H - \frac{\omega_s^2}{\omega_H}\right|\sqrt{\frac{R}{Z_s}}.$$

Fittings, as described herein, may be based on separately- or jointly-estimated resistivity and induction. As should be expected, the mass can be set arbitrarily, resulting in identical model impedance. It should be noted that these are lumped parameters (given the set mass) as opposed to actual physical loudspeaker parameters as the moving mass, the volume of enclosure, and the diaphragm area are unknown, and hence, cannot be backed out of the lumped parameters to get the physical loudspeaker parameters. However, this is not important to the present application where the lumped parameters (given the set mass) are sufficient to model the impedance. In other words, if the mass is set differently, then the estimated lumped loudspeaker parameters change, and leave the resulting model of the impedance unchanged.

However, this is not the case for the voice coil voltage to cone excursion transfer function which is given above as $$\frac{X(s)}{U(s)}$$

in Equation 5. If the impedances remain unchanged, but the force factor $\phi$ changes, then the excursion transfer function also changes. Hence, an estimate of the actual mass may be needed in some embodiments in order to render the excursion transfer function uniquely determined.

The issue of an under-determined system, in the sense of estimating the core four loudspeaker parameters from the primary resonance of the impedance, is also evident from the expression of the sub-impedance:

$$Z_3(s) = \frac{1}{\frac{m}{\phi^2}s + \frac{r}{\phi^2} + \frac{1}{\phi^2 cs}}. \quad \text{(Eq. 21)}$$

The three independent parameters determining the sub-impedance are:

$$\frac{m}{\phi^2}, \frac{r}{\phi^2},$$

and $\phi^2 c$.

From these three independent lumped parameters, it is not possible to calculate the four core loudspeaker parameters $\phi^2$, m, r, c. The three independent lumped parameters above uniquely determine the impedance, but as also noted above, the four core loudspeaker parameters are required to determine the voice coil voltage to cone excursion transfer function, which is needed in order to predict the cone movement as part of the loudspeaker protection, in embodiments. Hence, either one of the core loudspeaker parameters must be known, e.g., from the manufacturer, and reasonably assumed fixed, or an additional measurement may be required, facilitating the break-down of the three lumped parameters into the four core parameters. Consequently, it is sensible to specify the sub-component responsible of the primary resonance of the impedance in terms of the lumped parameters, and in terms of traditional lumped parameters as used for the secondary resonance component $Z_6(s)$ the sub-impedance is specified as $$Z_3(s) = \frac{s}{C_3 s^2 + \frac{1}{R_3} s + \frac{1}{L_3}}, \quad \text{(Eq. 22)}$$

where $C_3 = \frac{m}{\phi^2}$ (electrical capacitance representing mechanical mass), $R_3 = \frac{\phi^2}{r}$ (resistance due to mechanical losses), and $L_3 = \phi^2 c$ (electrical inductance representing mechanical compliance).

In terms of estimating the lumped parameters directly from the parameters for resistivity R, resonance frequency $\omega_s$, impedance at resonance frequency $Z_s$, the low frequency corresponding to geometric mean impedance $\omega_L$, and the high frequency corresponding to geometric mean impedance $\omega_H$, estimated from the measured impedance, the simplified solutions below in Equations and parameters described for the secondary resonance component apply directly as the voice coil inductance is negligible at the frequency of the primary resonance. Note that the compliance, c, is a lumped parameter also including the effect of an enclosure, in embodiments:

$$R_3 = Z_s - R,$$

$$L_3 = \frac{1}{\omega_L} |Z_s - R| \left| \left(\frac{\omega_L}{\omega_s}\right)^2 - 1 \right| \sqrt{\frac{R}{Z_s}}, \text{ and}$$

$$C_3 = \frac{1}{\omega_s^2 L_3}.$$

Beyond the lumped parameters, the force-factor $\phi$ may be specifically estimated in embodiments to uniquely determine the voice coil voltage to cone excursion transfer function. Estimating, or knowing, any one of the four core loudspeaker parameters will allow unique identification of the force-factor, and consequently, the excursion transfer function. A consideration to manufacturing, aging, and/or environmentally induced changes to the parameters may be used in embodiments for determining if any one parameter can be considered fixed, and if it is known or easily measurable.

In embodiments, the nominal force-factor specified by the manufacturer of the loudspeaker may be used. If it is associated with a tolerance, $\alpha_\phi$:

$$\phi = (1 \pm \alpha_\phi)\phi_{nom}. \quad \text{(Eq. 23)}$$

As can be seen from the transfer function in Equation 5 above, it is straightforward to incorporate this tolerance into the maximum excursion by lowering it with a corresponding factor, i.e.:

$$x_{max} = (1 - \alpha_\phi) x_{max_{nom}}. \quad \text{(Eq. 24)}$$

In embodiments, the lower end force-factor may be used as:

$$\phi = (1 - \alpha_\phi)\phi_{nom}, \quad \text{(Eq. 25)}$$

to obtain the worst case possible excursion, and leave the maximum excursion, $x_{max}$, as specified by the manufacturer $x_{max} = x_{max_{nom}}$. Either case assumes that only manufacturing variance affects the force-factor $\phi$, i.e., that no change due to aging, temperature, or other environmental factor, although such considerations may be taken into account in embodiments.

In embodiments, the primary resonance and its parameters $\omega_s$, $Z_s$, $\omega_L$, and $\omega_H$ may be identified from a measured impedance by focusing on the 500 Hz to 2000 Hz frequency range, which is a typical range for a primary resonance of a microspeaker and enclosure for some devices such as mobile and smart phones.

The secondary resonance impedance component ($Z_6(s)$ as in the description of Equation 4), is responsible for the secondary resonance appearing between lower frequencies and mid-ranges frequencies of the impedance estimate, e.g., at and/or around approximately 4 kHz. Equivalent to Equation 12 above with respect to the primary resonance, the resonance frequency is given by:

$$\omega_s = \frac{1}{\sqrt{C_6 L_6}}. \quad \text{(Eq. 26)}$$

However, while magnitude of the impedance at the primary resonance is largely determined by $Z_1(s) + Z_3(S)$, at the secondary resonance the inductance may start to take on a non-negligible size in some embodiments. Hence, at the secondary resonance, the inductance may need to be taken into consideration when finding the impedance at the resonance frequency.

$$R_6 = \sqrt{Z_s^2 - (\omega_s L)^2} - R, \text{ and} \quad \text{(Eq. 27)}$$

$$(R + R_6)^2 = Z_s^2 - (\omega_s L)^2. \quad \text{(Eq. 28)}$$

Likewise, as similarly described above for the primary resonance, the two frequencies where the impedance has decreased from its secondary resonance value given above to:

$$Z_M = |Z_1(\omega_{L/H}) + Z_2(\omega_{L/H}) + Z_6(\omega_{L/H})| = \sqrt{RZ_s}, \quad \text{(Eq. 29)}$$

are denoted $\omega_L$ and $\omega_H$, respectively, and determined from:

$$|Z_1(\omega) + Z_2(\omega) + Z_6(\omega)| = \left| R + j\omega L + \frac{1}{j\omega C_6 + \frac{1}{R_6} - j\frac{1}{L_6 \omega}} \right| = \quad \text{(Eq. 30)}$$

$$\left| R + j\omega L + \frac{1}{\frac{1}{R_6} + j\left(\omega C_6 - \frac{1}{L_6 \omega}\right)} \right| =$$

$$\left| R + j\omega L + \frac{1}{\frac{1}{R_6} + j\frac{1}{L_6 \omega}\left(\left(\frac{\omega}{\omega_s}\right)^2 - 1\right)} \right| =$$

$$\left| \frac{\omega\left(L_6(R_6 + R) - LR_6\left(\left(\frac{\omega}{\omega_s}\right)^2 - 1\right)\right) +}{j\left(\omega^2 LL_6 + RR_6\left(\left(\frac{\omega}{\omega_s}\right)^2 - 1\right)\right)} \right| \Rightarrow,$$

and

-continued $$|Z_1(\omega) + Z_2(\omega) + Z_6(\omega)|^2 = \quad \text{(Eq. 31)}$$

$$\frac{\omega^2\left(L_6(R_6+R) - LR_6\left(\left(\frac{\omega}{\omega_s}\right)^2 - 1\right)\right)^2 +}{(L_6\omega)^2 + R_6^2\left(\left(\frac{\omega}{\omega_s}\right)^2 - 1\right)^2} =$$

$$\frac{\left(\left(\frac{\omega}{\omega_s}\right)^2 - 1\right)^2((\omega LR_6)^2 + (RR_6)^2) + (\omega^2 LL_6)^2 +}{\omega^2(L_6(R_6+R))^2 - 2\omega^2 L_6 LR_6^2\left(\left(\frac{\omega}{\omega_s}\right)^2 - 1\right)}{(L_6\omega)^2 + R_6^2\left(\left(\frac{\omega}{\omega_s}\right)^2 - 1\right)^2} =$$

$$\frac{L_6^2\left((\omega^2 L)^2 + \omega^2(R_6+R)^2\right) - 2\omega^2 L_6 LR_6^2\left(\left(\frac{\omega}{\omega_s}\right)^2 - 1\right) +}{((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2} =$$

$$\frac{\omega^2 L_6\left(L_6(\omega L)^2 + L_6(R_6+R)^2 - 2LR_6^2\left(\left(\frac{\omega}{\omega_s}\right)^2 - 1\right)\right) +}{((\omega L)^2 + R^2)R_6^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2}.$$

For embodiments where the inductance of the voice coil is negligible, Equation 31 simplifies to:

$$|Z_1(\omega) + Z_2(\omega) + Z_6(\omega)|^2 \approx |Z_1(\omega) + Z_6(\omega)|^2 = \quad \text{(Eq. 32)}$$

$$\frac{\omega^2(L_6(R_6+R))^2 + (RR_6)^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2} =$$

$$\frac{L_6^2(\omega(R_6+R))^2 + (RR_6)^2\left(\left(\frac{\omega}{\omega_s}\right)^2 - 1\right)^2}{(L_6\omega)^2 + R_6^2\left(\left(\frac{\omega}{\omega_s}\right)^2 - 1\right)^2},$$

and at the lower geometric mean frequency, this equals:

$$Z_M^2 = \quad \text{(Eq. 33)}$$

$$|Z_1(\omega_L) + Z_6(\omega_L)|^2 = \frac{L_6^2(\omega_L(R_6+R))^2 + (RR_6)^2\left(\left(\frac{\omega_L}{\omega_s}\right)^2 - 1\right)^2}{(L_6\omega)^2 + R_6^2\left(\left(\frac{\omega}{\omega_s}\right)^2 - 1\right)^2} =$$

$$RZ_s \Leftrightarrow L_6^2\omega_L^2((R_6+R)^2 - RZ_s) =$$

$$RR_6^2(Z_s - R)\left(\left(\frac{\omega_L}{\omega_s}\right)^2 - 1\right)^2$$

$$L_6^2\omega_L^2 Z_s(Z_s - R) = R(Z_s - R)^3\left(\left(\frac{\omega_L}{\omega_s}\right)^2 - 1\right)^2 \Leftrightarrow L_6^2 =$$

$$\frac{R}{Z_s}\frac{1}{\omega_L^2}(Z_s - R)^2\left(\left(\frac{\omega_L}{\omega_s}\right)^2 - 1\right)^2 \Rightarrow L_6 =$$

$$\frac{1}{\omega_L}|Z_s - R|\left|\left(\frac{\omega_L}{\omega_s}\right)^2 - 1\right|\sqrt{\frac{R}{Z_s}}.$$

Accordingly, in embodiments, if the impedance of the voice coil inductance is negligible at the secondary resonance, then the three parameters responsible for the secondary resonance can be found from the measured properties ($\omega_s$, $Z_s$, and $\omega_L$) of the secondary resonance as:

$$R_6 = Z_s - R, \; L_6 = \frac{1}{\omega_L}|Z_s - R|\left|\left(\frac{\omega_L}{\omega_s}\right)^2 - 1\right|\sqrt{\frac{R}{Z_s}}, \; \text{and}$$

$$C_6 = \frac{1}{\omega_s^2 L_6}.$$

Impedance model fitter 202 is configured to fit the impedance components described above that are based on the voltage sense data and the current sense data used to estimate the impedance, including parameters thereof in embodiments, to generate an estimated impedance model using fitting components, e.g., a fit resistivity component, a fit inductance component, a fit primary resonance component, and a fit secondary resonance component. Each of these fitting components may receive its respective impedance estimation portion from the impedance estimator, in embodiments, while in other embodiments the entire impedance estimate may be provided and each fitting component may extract its appropriate impedance components and/or parameters. It should be noted, however, that in embodiments, any number of components and/or parameters may be estimated and/or fitted. It is also contemplated herein that in some embodiments, the fitting components may be included together as a single fitting component.

Impedance to excursion model converter 204 of upstream loudspeaker model estimation component 200 of FIG. 2 may include a bi-linear transform component, and the fitted plurality of estimated impedance components fitted by the impedance model fitter, described above, are received by impedance to excursion model converter 204. In some embodiments, one or more of the fitted components may be provided to the bi-linear transform component. The bi-linear transform component is configured to transform a continuous time transfer function to discrete time to generate the loudspeaker excursion model, as described below. The excursion model corresponding to the impedance model of may be calculated from the expression of the voice coil voltage to cone excursion transfer function given by Equation 5 which is reproduced here:

$$\frac{X(s)}{U(s)} = \frac{1}{\phi s}\frac{Z_3(s) + Z_6(s)}{Z_1(s) + Z_2(s) + Z_3(s) + Z_6(s)}. \quad \text{(Eq. 5)}$$

In embodiments where all components of the fitted, estimated impedance model are present and utilized (i.e., resistivity, inductance, primary resonance, and secondary resonance), the excursion transfer function becomes:

(Eq. 34)

$$\frac{X(s)}{U(s)} = \frac{1}{\phi s} \frac{\dfrac{s}{C_3 s^2 + \dfrac{1}{R_3}s + \dfrac{1}{L_3}} + \dfrac{s}{C_6 s^2 + \dfrac{1}{R_6}s + \dfrac{1}{L_6}}}{R + sL + \dfrac{s}{C_3 s^2 + \dfrac{1}{R_3}s + \dfrac{1}{L_3}} + \dfrac{s}{C_6 s^2 + \dfrac{1}{R_6}s + \dfrac{1}{L_6}}},$$

$$= \frac{1}{\phi s} \frac{\dfrac{sL_3 R_3}{L_3 R_3 C_3 s^2 + L_3 s + R_3} + \dfrac{sL_6 R_6}{L_6 R_6 C_6 s^2 + L_6 s + R_6}}{R + sL + \dfrac{sL_3 R_3}{L_3 R_3 C_3 s^2 + L_3 s + R_3} + \dfrac{sL_6 R_6}{L_6 R_6 C_6 s^2 + L_6 s + R_6}}$$

$$= \frac{1}{\phi} \frac{L_3 R_3 (L_6 R_6 C_6 s^2 + L_6 s + R_6) + L_6 R_6 (L_3 R_3 C_3 s^2 + L_3 s + R_3)}{\begin{pmatrix} (R+sL)(L_3 R_3 C_3 s^2 + L_3 s + R_3)(L_6 R_6 C_6 s^2 + L_6 s + R_6) + \\ sL_3 R_3 (L_6 R_6 C_6 s^2 + L_6 s + R_6) \ldots + sL_6 R_6 (L_3 R_3 C_3 s^2 + L_3 s + R_3) \end{pmatrix}}$$

$$= \frac{b_{s,0} s^2 + b_{s,1} s + b_{s,2}}{a_{s,0} s^5 + a_{s,1} s^4 + a_{s,2} s^3 + a_{s,3} s^2 + a_{s,4} s + a_{s,5}},$$

where (Eq. 35)

$$b_{s,0} = \frac{1}{\phi} L_3 R_3 L_6 R_6 (C_3 + C_6),$$

$$b_{s,1} = \frac{1}{\phi} L_3 L_6 (R_3 + R_6),$$

$$b_{s,2} = \frac{1}{\phi} R_3 R_6 (L_3 + L_6),$$

$$a_{s,0} = L L_3 R_3 C_3 L_6 R_6 C_6,$$

$$a_{s,1} = L L_3 R_3 C_3 L_6 + L L_3 L_6 R_6 C_6 + R L_3 R_3 C_3 L_6 R_6 C_6,$$

$$a_{s,2} = \frac{L L_3 R_3 C_3 R_6 + L L_3 L_6 + L R_3 L_6 R_6 C_6 + R L_3 R_3 C_3 L_6 + R L_3 L_6 R_6 C_6 +}{L_3 R_3 L_6 R_6 C_6 + L_6 R_6 L_3 R_3 C_3},$$

$$a_{s,3} = L L_3 R_6 + L R_3 L_6 + R L_3 R_3 C_3 R_6 + R R_3 L_6 R_6 C_6 + L_3 R_3 L_6 + L_6 R_6 L_3,$$

$$a_{s,4} = L R_3 R_6 + R L_3 R_6 + R R_3 L_6 + L_3 R_3 R_6 + L_6 R_6 R_3, \text{ and}$$

$$a_{s,5} = R R_3 R_6.$$

The bi-linear transform component is configured to transform the continuous time transfer function to discrete time to generate the excursion model. The bi-linear transform, $$s = \frac{z-1}{z+1}\frac{2}{T}, \quad \text{(Eq. 36)}$$

is applied to the continuous time transfer function represented in Equations 5, 34, and 35, to find a corresponding discrete time transfer function:

$$\frac{X(z)}{U(z)} = \frac{b_{s,0}\left(\frac{z-1}{z+1}\frac{2}{T}\right)^2 + b_{s,1}\left(\frac{z-1}{z+1}\frac{2}{T}\right) + b_{s,2}}{a_{s,0}\left(\frac{z-1}{z+1}\frac{2}{T}\right)^5 + a_{s,1}\left(\frac{z-1}{z+1}\frac{2}{T}\right)^4 + a_{s,2}\left(\frac{z-1}{z+1}\frac{2}{T}\right)^3 + a_{s,3}\left(\frac{z-1}{z+1}\frac{2}{T}\right)^2 + a_{s,4}\left(\frac{z-1}{z+1}\frac{2}{T}\right) + a_{s,5}} \quad \text{(Eq. 37)}$$

$$= \frac{\left(\frac{T}{2}\right)^3 b_{s,0}(z-1)^2(z+1)^3 + \left(\frac{T}{2}\right)^4 b_{s,1}(z-1)(z+1)^4 + \left(\frac{T}{2}\right)^5 b_{s,2}(z+1)^5}{\left(a_{s,0}(z-1)^5 + \left(\frac{T}{2}\right)a_{s,1}(z-1)^4(z+1) + \left(\frac{T}{2}\right)^2 a_{s,2}(z-1)^3(z+1)^2 \ldots + \left(\frac{T}{2}\right)^3 a_{s,3}(z-1)^2(z+1)^3 + \left(\frac{T}{2}\right)^4 a_{s,4}(z-1)(z+1)^4 + \left(\frac{T}{2}\right)^5 a_{s,5}(z+1)^5\right)}$$

$$= \frac{(1+z^{-1})^3(b_0 + b_1 z^{-1} + b_2 z^{-2})}{1 + a_1 z^{-1} + a_2 z^{-2} + a_3 z^{-3} + a_4 z^{-4} + a_5 z^{-5}},$$

where $$b_0 = \frac{\left(\frac{T}{2}\right)^3 b_{s,0} + \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}, \quad \text{(Eq. 38)}$$

$$b_1 = \frac{-2\left(\frac{T}{2}\right)^3 b_{s,0} + 2\left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$b_2 = \frac{\left(\frac{T}{2}\right)^3 b_{s,0} - \left(\frac{T}{2}\right)^4 b_{s,1} + \left(\frac{T}{2}\right)^5 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_1 = \frac{-5a_{s,0} - 3\left(\frac{T}{2}\right)a_{s,1} - \left(\frac{T}{2}\right)^2 a_{s,2} + \left(\frac{T}{2}\right)^3 a_{s,3} + 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_2 = \frac{10a_{s,0} + 2\left(\frac{T}{2}\right)a_{s,1} - 2\left(\frac{T}{2}\right)^2 a_{s,2} - 2\left(\frac{T}{2}\right)^3 a_{s,3} + 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_3 = \frac{-10a_{s,0} + 2\left(\frac{T}{2}\right)a_{s,1} + 2\left(\frac{T}{2}\right)^2 a_{s,2} - 2\left(\frac{T}{2}\right)^3 a_{s,3} - 2\left(\frac{T}{2}\right)^4 a_{s,4} + 10\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}},$$

$$a_4 = \frac{5a_{s,0} - 3\left(\frac{T}{2}\right)a_{s,1} + \left(\frac{T}{2}\right)^2 a_{s,2} + \left(\frac{T}{2}\right)^3 a_{s,3} - 3\left(\frac{T}{2}\right)^4 a_{s,4} + 5\left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}, \text{ and}$$

$$a_5 = \frac{-a_{s,0} + \left(\frac{T}{2}\right)a_{s,1} - \left(\frac{T}{2}\right)^2 a_{s,2} + \left(\frac{T}{2}\right)^3 a_{s,3} - \left(\frac{T}{2}\right)^4 a_{s,4} + \left(\frac{T}{2}\right)^5 a_{s,5}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4} + \left(\frac{T}{2}\right)^5 a_{s,5}}.$$

Given the embodiments described herein for which less than all of the impedance components of the estimated impedance model may be utilized or present in the model, e.g., as described above, it is contemplated in this disclosure that such estimated impedance models may be converted to excursion models using simplified transforms by the bi-linear transform component.

In the case of a negligible or absent secondary resonance component, the excursion transfer function simplifies to:

$$\frac{X(s)}{U(s)} = \frac{1}{\phi s} \frac{Z_3(s)}{Z_1(s) + Z_2(s) + Z_3(s)} \quad \text{(Eq. 39)}$$

$$= \frac{1}{\phi s} \frac{\dfrac{s}{C_3 s^2 + \dfrac{1}{R_3} s + \dfrac{1}{L_3}}}{R + sL + \dfrac{s}{C_3 s^2 + \dfrac{1}{R_3} s + \dfrac{1}{L_3}}}$$

$$= \frac{1}{\phi} \frac{L_3 R_3}{(R + sL)(L_3 R_3 C_3 s^2 + L_3 s + R_3) + s L_3 R_3}$$

$$= \frac{b_{s,0}}{a_{s,0} s^3 + a_{s,1} s^2 + a_{s,2} s + a_{s,3}},$$

where $$b_{s,0} = \frac{1}{\phi} L_3 R_3, \quad \text{(Eq. 40)}$$

$a_{s,0} = L L_3 R_3 C_3,$ $a_{s,1} = L L_3 + R L_3 R_3 C_3,$ $a_{s,2} = L R_3 + R L_3 + L_3 R_3,$ and $a_{s,3} = R R_3.$ The bi-linear transform given in Equation 36 is applied to the continuous time transfer function represented in Equations 5, 39, and 40, to find a corresponding discrete time transfer:

(Eq. 41)

$$\frac{X(z)}{U(z)} = \frac{b_{s,0}}{a_{s,0}\left(\dfrac{z-1}{z+1}\dfrac{2}{T}\right)^3 + a_{s,1}\left(\dfrac{z-1}{z+1}\dfrac{2}{T}\right)^2 + a_{s,2}\left(\dfrac{z-1}{z+1}\dfrac{2}{T}\right) + a_{s,3}}$$

$$= \frac{\left(\dfrac{T}{2}\right)^3 b_{s,0}(z+1)^3}{a_{s,0}(z-1)^3 + \left(\dfrac{T}{2}\right) a_{s,1}(z-1)^2(z+1) + \left(\dfrac{T}{2}\right)^2 a_{s,2}(z+1)^2(z-1)^2 + \left(\dfrac{T}{2}\right)^3 a_{s,3}(z+1)^3}$$

$$= \frac{b_0(1 + z^{-1})^3}{1 + a_1 z^{-1} + a_2 z^{-2} + a_3 z^{-3}},$$

where (Eq. 42)

$$b_0 = \frac{\left(\dfrac{T}{2}\right)^3 b_{s,0}}{a_{s,0} + \left(\dfrac{T}{2}\right) a_{s,1} + \left(\dfrac{T}{2}\right)^2 a_{s,2} + \left(\dfrac{T}{2}\right)^3 a_{s,3}},$$

$$a_1 = \frac{-3 a_{s,0} - \left(\dfrac{T}{2}\right) a_{s,1} + \left(\dfrac{T}{2}\right)^2 a_{s,2} + 3\left(\dfrac{T}{2}\right)^3 a_{s,3}}{a_{s,0} + \left(\dfrac{T}{2}\right) a_{s,1} + \left(\dfrac{T}{2}\right)^2 a_{s,2} + \left(\dfrac{T}{2}\right)^3 a_{s,3}},$$

$$a_2 = \frac{3 a_{s,0} - \left(\dfrac{T}{2}\right) a_{s,1} - \left(\dfrac{T}{2}\right)^2 a_{s,2} + 3\left(\dfrac{T}{2}\right)^3 a_{s,3}}{a_{s,0} + \left(\dfrac{T}{2}\right) a_{s,1} + \left(\dfrac{T}{2}\right)^2 a_{s,2} + \left(\dfrac{T}{2}\right)^3 a_{s,3}}, \text{ and}$$

$$a_3 = \frac{-a_{s,0} + \left(\dfrac{T}{2}\right) a_{s,1} - \left(\dfrac{T}{2}\right)^2 a_{s,2} + \left(\dfrac{T}{2}\right)^3 a_{s,3}}{a_{s,0} + \left(\dfrac{T}{2}\right) a_{s,1} + \left(\dfrac{T}{2}\right)^2 a_{s,2} + \left(\dfrac{T}{2}\right)^3 a_{s,3}}.$$

Accordingly, the bi-linear transform component is configured to transform the continuous time transfer function to discrete time to generate the excursion model with a negligible or omitted secondary resonance component, but with the presence of resistive, inductive, and primary resonance components.

In the case of a negligible or omitted voice coil inductance component, but presence of a secondary resonance component, the excursion transfer function becomes:

(Eq. 43)

$$\frac{X(s)}{U(s)} = \frac{1}{\phi s} \frac{Z_3(s) + Z_6(s)}{Z_1(s) + Z_3(s) + Z_6(s)}$$

$$= \frac{1}{\phi s} \frac{\dfrac{s}{C_3 s^2 + \dfrac{1}{R_3} s + \dfrac{1}{L_3}} + \dfrac{s}{C_6 s^2 + \dfrac{1}{R_6} s + \dfrac{1}{L_6}}}{R + \dfrac{s}{C_3 s^2 + \dfrac{1}{R_3} s + \dfrac{1}{L_3}} + \dfrac{s}{C_6 s^2 + \dfrac{1}{R_6} s + \dfrac{1}{L_6}}}$$

$$= \frac{1}{\phi s} \frac{\dfrac{s L_3 R_3}{L_3 R_3 C_3 s^2 + L_3 s + R_3} + \dfrac{s L_6 R_6}{L_6 R_6 C_6 s^2 + L_6 s + R_6}}{R + \dfrac{s L_3 R_3}{L_3 R_3 C_3 s^2 + L_3 s + R_3} + \dfrac{s L_6 R_6}{L_6 R_6 C_6 s^2 + L_6 s + R_6}}$$

$$= \frac{1}{\phi} \frac{L_3 R_3 (L_6 R_6 C_6 s^2 + L_6 s + R_6) + L_6 R_6 (L_3 R_3 C_3 s^2 + L_3 s + R_3)}{R(L_3 R_3 C_3 s^2 + L_3 s + R_3)(L_6 R_6 C_6 s^2 + L_6 s + R_6) \ldots +}$$

$$s L_3 R_3 (L_6 R_6 C_6 s^2 + L_6 s + R_6) + s L_6 R_6 (L_3 R_3 C_3 s^2 + L_3 s + R_3)$$

$$= \frac{b_{s,0} s^2 + b_{s,1} s + b_{s,2}}{a_{s,0} s^4 + a_{s,1} s^3 + a_{s,2} s^2 + a_{s,3} s + a_{s,4}},$$

where (Eq. 44)

$$b_{s,0} = \frac{1}{\phi} L_3 R_3 L_6 R_6 (C_3 + C_6),$$

$$b_{s,1} = \frac{1}{\phi} L_3 L_6 (R_3 + R_6),$$

$$b_{s,2} = \frac{1}{\phi} R_3 R_6 (L_3 + L_6),$$

$a_{s,0} = R L_3 R_3 C_3 L_6 R_6 C_6,$ $a_{s,1} = R L_3 R_3 C_3 L_6 + R L_3 L_6 R_6 C_6 + L_3 R_3 L_6 R_6 C_6 + L_6 R_6 L_3 R_3 C_3,$ $a_{s,2} = R L_3 R_3 C_3 R_6 + R R_3 L_6 R_6 C_6 + L_3 R_3 L_6 + L_6 R_6 L_3,$ $a_{s,3} = R L_3 R_6 + R R_3 L_6 + L_3 R_3 R_6 + L_6 R_6 R_3,$ and $a_{s,4} = R R_3 R_6.$ The bi-linear transform given in Equation 36 is applied to the continuous time transfer function represented in Equations 5, 43, and 44, to find a corresponding discrete time transfer function:

(Eq. 45)

$$\frac{X(z)}{U(z)} = \frac{b_{s,0}\left(\frac{z-12}{z+1T}\right)^2 + b_{s,1}\left(\frac{z-12}{z+1T}\right) + b_{s,2}}{a_{s,0}\left(\frac{z-12}{z+1T}\right)^4 + a_{s,1}\left(\frac{z-12}{z+1T}\right)^3 + a_{s,2}\left(\frac{z-12}{z+1T}\right)^2 + a_{s,3}\left(\frac{z-12}{z+1T}\right) + a_{s,4}}$$

$$= \frac{\left(\frac{T}{2}\right)^2 b_{s,0}(z-1)^2(z+1)^3 + \left(\frac{T}{2}\right)^3 b_{s,1}(z-1)(z+1)^3 + \left(\frac{T}{2}\right)^4 b_{s,2}(z+1)^4}{a_{s,0}(z-1)^4 + \left(\frac{T}{2}\right)a_{s,1}(z-1)^3(z+1) + \left(\frac{T}{2}\right)^2 a_{s,2}(z-1)^2(z+1)^2 \ldots + \left(\frac{T}{2}\right)^3 a_{s,3}(z-1)(z+1)^3 + \left(\frac{T}{2}\right)^4 a_{s,4}(z+1)^4}$$

$$= \frac{(1+z^{-1})^2(b_0 + b_1 z^{-1} + b_2 z^{-2})}{1 + a_1 z^{-1} + a_2 z^{-2} + a_3 z^{-3} + a_4 z^{-4}},$$

where (Eq. 46)

$$b_0 = \frac{\left(\frac{T}{2}\right)^2 b_{s,0} + \left(\frac{T}{2}\right)^3 b_{s,1} + \left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$b_1 = \frac{-2\left(\frac{T}{2}\right)^2 b_{s,0} + 2\left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$b_2 = \frac{\left(\frac{T}{2}\right)^2 b_{s,0} - \left(\frac{T}{2}\right)^3 b_{s,1} + \left(\frac{T}{2}\right)^4 b_{s,2}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$a_1 = \frac{-4a_{s,0} - 2\left(\frac{T}{2}\right)a_{s,1} + 2\left(\frac{T}{2}\right)^3 a_{s,3} + 4\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$a_2 = \frac{6a_{s,0} - 2\left(\frac{T}{2}\right)^2 a_{s,2} + 6\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}},$$

$$a_3 = \frac{-4a_{s,0} + 2\left(\frac{T}{2}\right)a_{s,1} - 2\left(\frac{T}{2}\right)^3 a_{s,3} + 4\left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}}, \text{ and}$$

$$a_4 = \frac{a_{s,0} - \left(\frac{T}{2}\right)a_{s,1} + \left(\frac{T}{2}\right)^2 a_{s,2} - \left(\frac{T}{2}\right)^3 a_{s,3} + \left(\frac{T}{2}\right)^4 a_{s,4}}{a_{s,0} + \left(\frac{T}{2}\right)a_{s,1} + \left(\frac{T}{2}\right)^2 a_{s,2} + \left(\frac{T}{2}\right)^3 a_{s,3} + \left(\frac{T}{2}\right)^4 a_{s,4}}.$$

Accordingly, the bi-linear transform component is configured to transform the continuous time transfer function to discrete time to generate the excursion model with a negligible or omitted voice coil inductance component, but with the presence of a secondary resonance component as well as resistive and inductive components.

If the voice coil inductance negligible or absent, and the secondary resonance is negligible or absent, the excursion transfer function simplifies to:

$$\frac{X(s)}{U(s)} = \frac{1}{\phi s}\frac{Z_3(s)}{Z_1(s)+Z_3(s)} \quad \text{(Eq. 47)}$$

$$= \frac{1}{\phi s}\frac{\dfrac{s}{C_3 s^2 + \dfrac{1}{R_3}s + \dfrac{1}{L_3}}}{\dfrac{s}{C_3 s^2 + \dfrac{1}{R_3}s + \dfrac{1}{L_3}}}$$

$$= \frac{1}{\phi}\frac{L_3 R_3}{R(L_3 R_3 C_3 s^2 + L_3 s + R_3) + sL_3 R_3}$$

$$= \frac{b_{s,0}}{a_{s,0}s^2 + a_{s,1}s + a_{s,2}},$$

where $$b_{s,0} = \frac{1}{\phi}L_3 R_3, \quad \text{(Eq. 48)}$$

$$a_{s,0} = RL_3 R_3 C_3,$$

$$a_{s,1} = RL_3 + L_3 R_3, \text{ and}$$

$$a_{s,2} = RR_3.$$

The bi-linear transform given in Equation 36 is applied to the continuous time transfer function represented in Equations 5, 47, and 48, to find a corresponding discrete time transfer function:

$$\frac{X(z)}{U(z)} = \frac{b_{s,0}}{a_{s,0}\left(\dfrac{z-12}{z+1T}\right)^2 + a_{s,1}\left(\dfrac{z-12}{z+1T}\right) + a_{s,2}} \quad \text{(Eq. 49)}$$

$$= \frac{\left(\dfrac{T}{2}\right)^2 b_{s,0}(z+1)^2}{a_{s,0}(z-1)^2 + \left(\dfrac{T}{2}\right)a_{s,1}(z-1)(z+1) + \left(\dfrac{T}{2}\right)^2 a_{s,2}(z+1)^2}$$

$$= \frac{b_0(1+z^{-1})^2}{1 + a_1 z^{-1} + a_2 z^{-2}},$$

where $$b_0 = \frac{\left(\dfrac{T}{2}\right)^2 b_{s,0}}{a_{s,0} + \left(\dfrac{T}{2}\right)a_{s,1} + \left(\dfrac{T}{2}\right)^2 a_{s,2}}, \quad \text{(Eq. 50)}$$

$$a_1 = \frac{-2a_{s,0} + 2\left(\dfrac{T}{2}\right)^2 a_{s,2}}{a_{s,0} + \left(\dfrac{T}{2}\right)a_{s,1} + \left(\dfrac{T}{2}\right)^2 a_{s,2}}, \text{ and}$$

$$a_2 = \frac{a_{s,0} - \left(\dfrac{T}{2}\right)a_{s,1} + \left(\dfrac{T}{2}\right)^2 a_{s,2}}{a_{s,0} + \left(\dfrac{T}{2}\right)a_{s,1} + \left(\dfrac{T}{2}\right)^2 a_{s,2}}.$$

Accordingly, the bi-linear transform component is configured to transform the continuous time transfer function to discrete time to generate the excursion model with a negligible or omitted voice coil inductance component and with a negligible or omitted secondary resonance component, but including resistive and primary resonance components.

It should also be noted that in embodiments the bi-linear transform component may be replaced with another transform component that utilizes another type of transform (i.e., other known transforms to convert from a continuous time to discrete time transfer function). In some embodiments, the excursion model comprises a continuous time transfer function. That is, bi-linear transform component is an exemplary implementation for one possible configuration according to embodiments.

Further detail regarding impedance to excursion model conversion is provided in U.S. Provisional Patent Application No. 62/415,026, entitled "System and Method for Loudspeaker Protection," filed on Oct. 31, 2016, the entirety of which is incorporated herein by reference.

Temperature predictor 206 is configured to receive a resistivity portion of the impedance model, as described above, via a connector 218, and to model or predict the temperature of the voice coil of the loudspeaker based thereon. In embodiments, a temperature model may be used to generate voice coil temperature prediction. That is, a voice coil temperature estimation/prediction 'T' may be based on resistivity variation with temperature. Temperature predictor 206 is configured to provide the temperature prediction to gain estimator 208 via a connector 220.

Gain estimator 208 is configured to receive the predicted voice coil temperature modeled by temperature predictor 206. Based on an estimated/predicted temperature T, and a specified $T_{max}$ of the voice coil (i.e., a maximum temperature above which continuous operation is not desired, as described herein), gain estimator 208 is configured to perform a heuristic method to calculate a full-band attenuation, $Gain_T$, of the audio signal, i.e., a gain change parameter. The gain change parameter may be an actual gain value, e.g., 0.8 when normal operational gain is 1.0, or may be a gain delta, e.g., 0.2 to achieve an effective gain of 0.8, according to embodiments. In such cases, the gain change parameter lowers the overall effective power of the audio signal, thus reducing the temperature of the voice coil. The gain change parameter may be 1.0, or a gain delta of 0.0, when it is not desired to lower the voice coil temperature, as described in further detail herein. In embodiments, a faster rate of increase for temperature T may result in the generation of a gain change parameter that reduces the overall effective gain more than a relatively slower rate of increase for temperature T. The gain change parameter may be provided to a temperature-constraining processing component, in embodiments. Gain estimator 208 may provide the gain change parameter to such temperature-constraining processing circuitry, e.g., of downstream audio signal processing component 102 of FIG. 1A via a connector 222.

IV. Example Downstream Processing Embodiments

As noted above, systems for protection of loudspeakers, such as microspeakers, along with their components such as downstream audio signal processing components, may be configured in various ways to provide loudspeaker protection.

In embodiments, by way of illustrative example and not limitation, a downstream audio signal processing component comprises one or more subcomponents configured to constrain the temperature of a loudspeaker (or voice coil thereof) during operation, constrain an excursion of the loudspeaker such as a predicted excursion of the diaphragm or cone corresponding to an audio signal, and suppress distortion of an audio signal to be played back by the loudspeaker. These functions of the downstream audio signal processing component may be based, at least in part, on temperature estimations/predictions, gain change parameters, and excursion models (and/or one or more parameters thereof), of the loudspeaker during its operation, as described herein.

Figure 4:
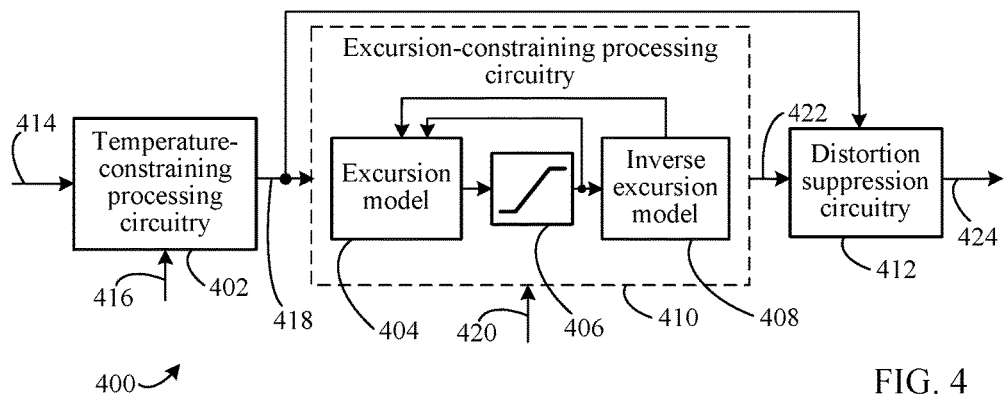
FIG. 4 shows a block diagram of a downstream audio signal processing component of a loudspeaker protection system, according to an example embodiment.

FIG. 4 shows a block diagram of a downstream audio signal processing component 400 of a loudspeaker protection system, according to an embodiment. Downstream audio signal processing component 400 may be a further embodiment of downstream audio signal processing component 102 of FIG. 1A. Downstream audio signal processing component 400 includes a temperature-constraining processing circuitry 402, excursion model circuitry 404, a limiter 406, inverse excursion model circuitry 408, and distortion suppression circuitry 412. In embodiments, excursion model circuitry 404, limiter 406, and inverse excursion model circuitry 408 may together comprise excursion-constraining processing circuitry 410.

Figure 5:
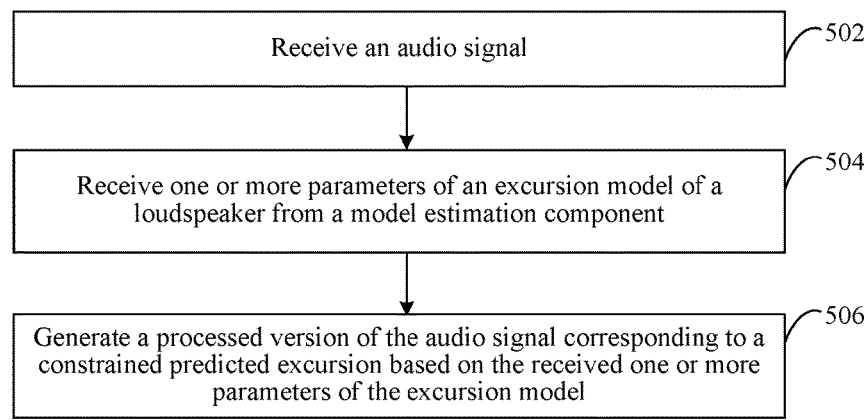
FIG. 5 shows a flowchart for excursion-constraining processing by the downstream audio signal processing component of FIG. 4, according to an example embodiment.

Referring also to FIG. 5, a flowchart 500 for excursion-constraining processing by excursion-constraining processing circuitry 410 of FIG. 4 is shown, according to an embodiment. That is, excursion-constraining processing circuitry 410, along with its subcomponents, may be configured to perform their respective functions in accordance with flowchart 500. Flowchart 500 is described as follows.

Audio signals are received (502), and an excursion model (and/or one or more parameters therefor) of the loudspeaker are received from a model estimation component (504). For example, excursion-constraining processing circuitry 410 of downstream audio signal processing component 400 receives an excursion model and/or one or more of its parameters from an upstream loudspeaker model estimation component (e.g., impedance to excursion model converter 204 of FIG. 2) via connector 420, in embodiments. In embodiments, and as described in further detail below with respect to FIG. 6, excursion-constraining processing circuitry 410 is configured to receive the excursion model or parameters thereof, e.g., at excursion model circuitry 404 and inverse excursion model circuitry 408, via connector 420, and receive an audio signal at excursion model circuitry 404 via connector 418. In embodiments, parameters of the excursion model may be provided to and received by excursion-constraining processing circuitry 410.

A processed version of the audio signal corresponding to a constrained predicted excursion is generated based on the received one or more parameters of the excursion model (506). A predicted diaphragm or cone excursion of the loudspeaker may be limited based on the excursion model by generating a processed version of the audio signal having a voltage corresponding to predicted excursion that has been constrained using one or more parameters of the excursion model. For example, excursion-constraining processing circuitry 410 is configured to limit a predicted excursion of a cone or diaphragm of a loudspeaker corresponding to an audio signal. In embodiments, excursion-constraining processing circuitry 410 is configured to limit a predicted excursion of a cone or diaphragm in a loudspeaker, such as diaphragm 122 of loudspeaker 106 of FIG. 1A, according to a generated predicted excursion model described above and received via connector 420. Excursion-constraining processing circuitry 410 is also configured to limit a predicted excursion of a loudspeaker corresponding to an audio signal according to one or more parameters of the excursion model received via connector 420, according to embodiments. That is, according to embodiments, the excursion model or parameters thereof may be provided to feed-forward excursion model circuitry 404 and integral feed-backward inverse excursion model circuitry 408, and along with limiter 406 (together comprising a non-linear constraint filter), a predicted excursion of a loudspeaker is limited by generating a processed version of the audio signal having a voltage corresponding to the constrained predicted excursion.

Distortion suppression circuitry 412 is configured to suppress unwanted distortion in the processed version of the audio signal. Distortion in the processed version of the audio signal is suppressed, thereby generating an output audio signal for playback by the loudspeaker. For instance, distortion suppression circuitry 412 may receive the processed version of the audio signal from excursion-constraining processing circuitry 410, via a connector 422, and suppress distortion, such as unwanted distortion, in the processed version of the audio signal. Distortion suppression circuitry 412 may also be configured to receive a temperature-constrained audio signal from temperature-constraining processing circuitry 402 via a connector 418, as described below, for use in the distortion suppression. In some cases, the processed version of the audio signal may have distortion present due to the processing of the excursion-constraining processing circuitry 410 to constrain a predicted excursion of a loudspeaker corresponding to an audio signal. Distortion suppression circuitry 412 is configured to suppress this distortion in the processed version of the audio signal based at least on frequency domain energy associated with the processed version of the audio signal, e.g., with frequency resolution such as power- or magnitude-spectra in embodiments. Accordingly, distortion suppression circuitry 412 is configured to generate an output audio signal for playback by the loudspeaker having suppressed distortion. The output audio signal may be provided for playback by the loudspeaker via a connector 424.

Constraining loudspeaker voice coil temperature may also be performed by downstream audio signal processing component 400 of FIG. 4, according to an embodiment. For example, temperature-constraining processing circuitry 402 is configured to receive an input audio signal via a connector 414. The input audio signal may be provided by a microphone, a processor, or a memory of a device (e.g., as recorded audio or the like), as described herein. In embodiments, the audio signal is received as a digital audio signal, although receiving analog audio signals is contemplated herein.

The input audio signal is processed according to the gain change parameter that is received from the voice coil temperature modeler to constrain the temperature of the voice coil in a temperature-constrained audio signal. For instance, temperature-constraining processing circuitry 402 is configured to process an input audio signal that is received via connector 414 according to the gain change parameter provided by gain estimator 208 of upstream loudspeaker model estimation component 200 or via connector 416 to reduce the temperature of a loudspeaker or a voice coil thereof. In embodiments, the gain change parameter is applied to the input audio signal to lower the overall effective gain when the temperature of a loudspeaker or voice coil exceeds a determined value or is increasing toward the determined value, as described herein. When the temperature is decreasing, the constraint thereof may be relaxed, and temperature-constraining processing circuitry 402 may process the input audio signal on connector 414 using, e.g., a unity gain, or a gain that is higher than the gain change parameter used to constrain the input audio signal.

A temperature-constrained audio signal may be provided to the first audio signal processing component as the audio signal described above. For example, temperature-constraining processing circuitry 402 is configured to provide the temperature-constrained audio signal to excursion-constraining processing circuitry 410 via connector 418. Embodiments may further include providing the temperature-constrained audio signal via connector 418 to distortion suppression circuitry 412, as noted above.

Figure 6:
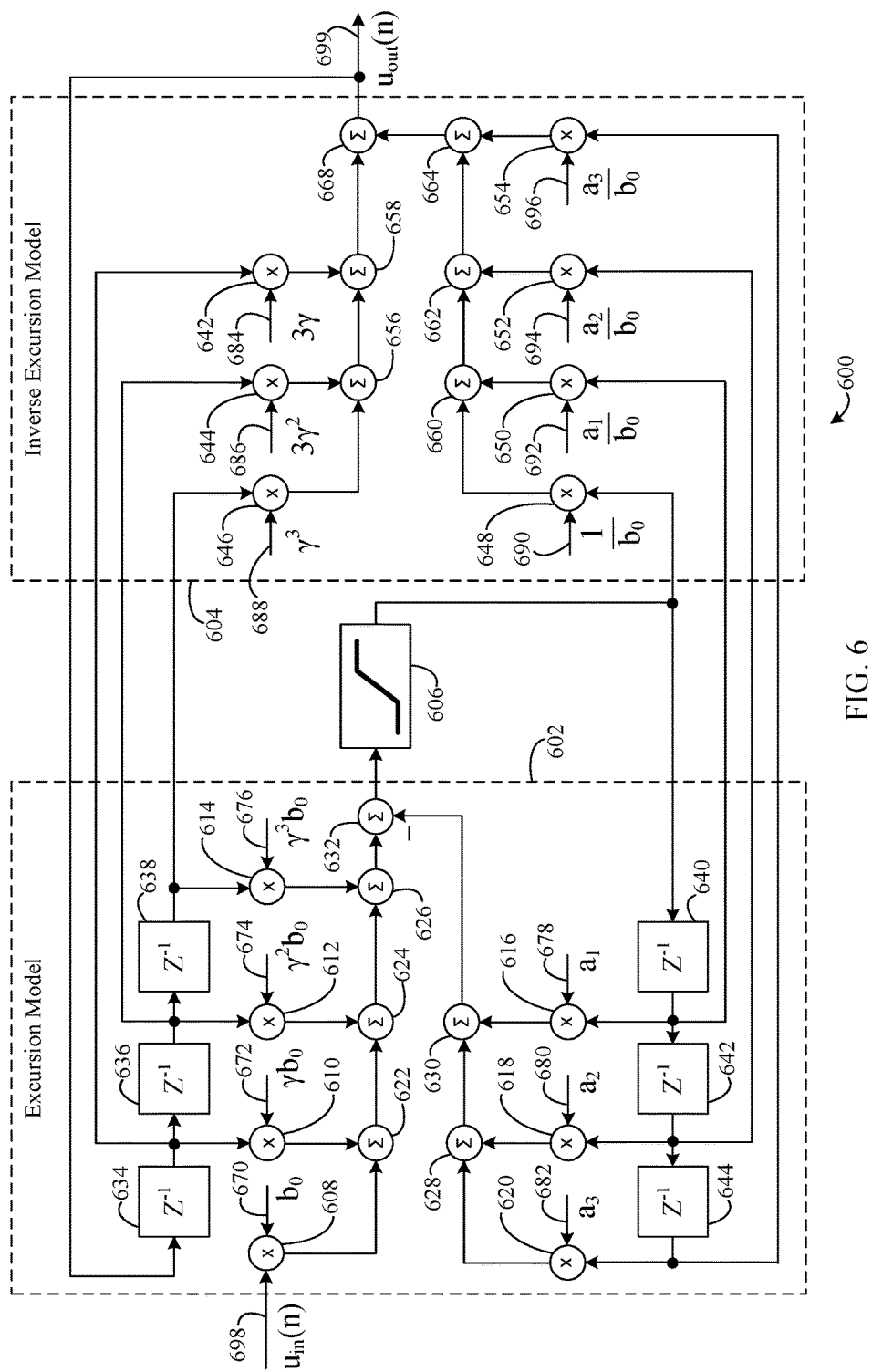
FIG. 6 shows a block diagram of excursion-constraining processing circuitry of a loudspeaker protection system, according to an example embodiment.

Excursion-constraining processing circuitry as described herein may be configured in various ways to constrain a predicted excursion of a loudspeaker corresponding to an audio signal. For example, FIG. 6 shows a block diagram of excursion-constraining processing circuitry 600 of a loudspeaker protection system, according to an embodiment. Excursion-constraining processing circuitry 600 may be a further embodiment of excursion-constraining processing circuitry 410 of FIG. 4. Excursion-constraining processing circuitry 600 includes excursion model circuitry 602, inverse excursion model circuitry 604, and a limiter 606 (together comprising a non-linear constraint filter). In embodiments, excursion-constraining processing circuitry 600 is configured to generate an excursion-constrained audio signal $u_{out}(n)$ on an output connector 699 from an input audio signal $u_{in}(n)$, received on an input connector 698, that corresponds to a predicted excursion of a loudspeaker using an excursion model (as described herein) and/or one or more parameters of the excursion model. The excursion-constrained audio signal $u_{out}(n)$ on output connector 699 is also provided as a feedback signal from inverse excursion model circuitry 604 to excursion model circuitry 602 (as also described in (906) of flowchart 900 in FIG. 9 below) as part of the non-linear functionality of excursion-constraining processing circuitry 600. As illustrated, excursion-constraining processing circuitry 600 is configured to process an audio signal to constrain a predicted excursion of a loudspeaker using parameters of an excursion model corresponding to resistivity, inductance, and primary resonance where secondary resistance is negligible or not desired in the excursion model. It should be noted, however, that other embodiments of excursion-constraining processing circuitry 600 are contemplated herein according to any combination of resistivity, inductance, primary resonance, and/or secondary resonance as described herein.

Excursion model circuitry 602 includes a plurality of sample signal delay components: sample signal delay component 634, sample signal delay component 636, sample signal delay component 638, sample signal delay component 640, sample signal delay component 642, and sample signal delay component 644. Each sample signal delay component is configured to add one unit delay to inputs received. For example, an input received at sample signal delay component 634 has one unit delay, and after sample signal delay component 636 two unit delays, and after sample signal delay component 638 three unit delays. Excursion model circuitry 602 also includes a first plurality of summers: a summer 622, a summer 624, a summer 626, a summer 628, a summer 630, and a summer 632; and a first plurality of multipliers: a multiplier 608, a multiplier 610, a multiplier 612, a multiplier 614, a multiplier 616, a multiplier 618, and a multiplier 620. Multiplier 608, multiplier 610, multiplier 612, multiplier 614, multiplier 616, multiplier 618, and multiplier 620 are each configured to generate a product of their respective inputs. Summer 632 is configured to subtract the input received via summer 630 from the input received via summer 626 as shown, while the remaining summers, summer 622, summer 624, summer 626, summer 628, and summer 630, are each configured to add their inputs together.

The described sample signal delay components, summers, and/or multipliers of excursion model circuitry 602 may be implemented in embodiments using a variety of circuits, electrical components, programmable logic devices, integrated circuits, and/or the like, in some embodiments, such as but without limitation, using firmware and/or software, using digital hardware like a digital signal processor (DSP) and/or an application specific integrated circuit (ASIC), etc. Generally, as used herein, the term circuitry includes DSPs, ASICs, etc., unless expressly noted otherwise.

As noted for Equation 5 in the Section above, a voice coil voltage to cone excursion transfer function using all impedance components (e.g., resistivity, inductance, primary resonance, and secondary resonance) may be denoted as, $$\frac{X(s)}{U(s)} = \frac{1}{\phi s} \frac{Z_3(s) + Z_6(s)}{Z_1(s) + Z_2(s) + Z_3(s) + Z_6(s)}, \quad \text{(Eq. 5)}$$

where a bi-linear transform component, $$S = \frac{z-1}{z+1} \frac{2}{T}, \quad \text{(Eq. 36)}$$

is configured to transform the continuous time transfer function to discrete time to generate the excursion model $$\frac{X(z)}{U(z)}$$

for all four impedance components as in Equation 38. As shown in Equations 39, 40, and 42, and noted above, excursion models that include less than all impedance components may be used, e.g., resistivity, inductance, and primary resonance may be used if the secondary resonance is negligible or not desired in the excursion model. For the embodiment illustrated in FIG. 6, the excursion model is given as:

$$\frac{X(z)}{U(z)} = \frac{b_0(1 + z^{-1})^3}{1 + a_1 z^{-1} + a_2 z^{-2} + a_3 z^{-3}}, \quad \text{(Eq. 42)}$$

which corresponds to excursion model circuitry 602.

In embodiments, inversion of the excursion model by inverse excursion model circuitry 604 may necessitate stabilization due to triple zero of inverse excursion model at $Z=-1$. In such cases, the excursion model may be modified by a stabilization factor $\gamma$ as:

$$\frac{X(z)}{U(z)} = \frac{b_0(1 + (z/\gamma)^{-1})^3}{1 + a_1 z^{-1} + a_2 z^{-2} + a_3 z^{-3}}, \quad \text{(Eq. 51)}$$

stabilization factor $\gamma$ may be a value between 0 and 1, such as 0.5 according to an embodiment.

Figure 7:
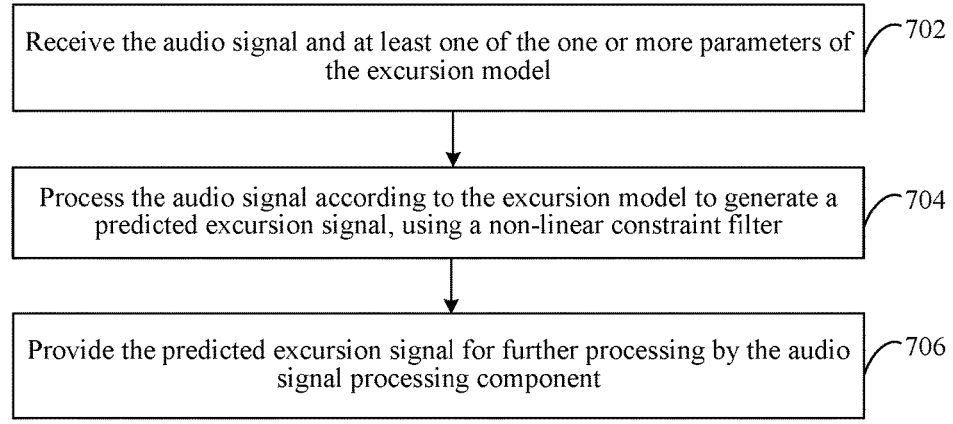
FIG. 7 shows a flowchart for excursion-constraining processing by the excursion-constraining processing circuitry of FIG. 6, according to an example embodiment.

Referring also to FIG. 7, a flowchart 700 for excursion-constraining processing by excursion-constraining processing circuitry 600 of FIG. 6 is shown, according to an embodiment. That is, excursion-constraining processing circuitry 600, along with its subcomponents such as excursion model circuitry 602, may be configured to perform their respective functions in accordance with flowchart 700. Flowchart 700 is described as follows.

Audio signals are received and one or more parameters of the excursion model are received (702). For example, excursion-constraining processing circuitry 600 is configured to receive the audio signal, $u_{in}(n)$, via input connector 698. As shown, multiplier 608 of excursion model circuitry 602 receives the audio signal which may correspond to a predicted excursion of the loudspeaker via input connector 698. Excursion-constraining processing circuitry 600 is also configured to receive one or more parameters of the excursion model, e.g., from an upstream loudspeaker model estimation component, such as impedance to excursion model converter 204 via connector 216 as shown in FIG. 2, according to embodiments. As shown, the first plurality of summers of excursion model circuitry 602 and the second plurality of summers of inverse excursion model circuitry 604 receive parameters of the excursion model via a first plurality of connectors for excursion model circuitry 602 and a second plurality of connectors for inverse excursion model circuitry 604. The first and second pluralities of connectors may be a further embodiment of connector 420 of FIG. 4.

For instance, with respect to the first plurality of connectors for excursion model circuitry 602: a connector 670 is configured to provide a first parameter "$b_0$" received by multiplier 608, a connector 672 is configured to provide a second parameter "$\gamma b_0$" received by multiplier 610, a connector 674 is configured to provide a third parameter "$\gamma^2 b_0$" received by multiplier 612, a connector 676 is configured to provide a fourth parameter "$\gamma^3 b_0$" received by multiplier 614, a connector 678 is configured to provide a fifth parameter "$a_1$" received by multiplier 616, a connector 680 is configured to provide a sixth parameter "$a_2$" received by multiplier 618, and a connector 682 is configured to provide a seventh parameter "$a_3$" received by multiplier 620.

The audio signal is processed according to the excursion model to generate a predicted excursion signal using a non-linear constraint filter (704). For example, the audio signal $u_{in}(n)$ received in (702) is processed by excursion model circuitry 602 of excursion-constraining processing circuitry 600 (which comprises a non-linear constraint filter) according to the excursion model using one or more of the parameters received in (702).

The product of the input audio signal $u_{in}(n)$ and the first parameter is provided to summer 622 from multiplier 608. Summer 622 also receives the product of the second parameter and a one unit delayed representation of excursion-constrained audio signal $u_{out}(n)$, via sample signal delay component 634, from multiplier 610. The sum output by summer 622 is provided to summer 624 which also receives the product of the third parameter and a two unit delayed representation of excursion-constrained audio signal $u_{out}(n)$, via signal delay 636 which receives the output of sample signal delay component 634, from multiplier 612. The sum output by summer 624 is provided to summer 626 which also receives the product of the fourth parameter and a three unit delayed representation of excursion-constrained audio signal $u_{out}(n)$, via sample signal delay component 638 which receives the output of sample signal delay component 636, from multiplier 614. The sum output by summer 626 is provided to summer 632.

Summer 630 receives the product of the fifth parameter and a one unit delayed representation of a limited predicted excursion signal from limiter 606, via sample signal delay component 640, from multiplier 616. Summer 628 receives the product of the sixth parameter and a two unit delayed representation of the limited predicted excursion signal, via sample signal delay component 642 which receives the output of sample signal delay component 640, from multiplier 618. Summer 628 also receives the product of the seventh parameter and a three unit delayed representation of the limited predicted excursion signal, via sample signal delay component 644 which receives the output of sample signal delay component 642, from multiplier 620. The sum output by summer 628 is provided to summer 630.

The sum output by summer 630 is provided to summer 632 where the sum output by summer 630 is subtracted from the sum output by summer 626.

The predicted excursion signal is provided for further processing by the audio signal processing component (706). For instance, summer 632 is configured to provide its output, i.e., the difference of the sum output by summer 630 and the sum output by summer 626, for further processing by limiter 606 of excursion-constraining processing circuitry 600.

Limiter 606 is configured to limit the predicted excursion signal to correspond with a constrained predicted excursion of a loudspeaker. Limiter 606 may comprise a clipper (e.g., hard- or soft-clipper, or the like), a clamper, and/or the like, in embodiments.

Figure 8:
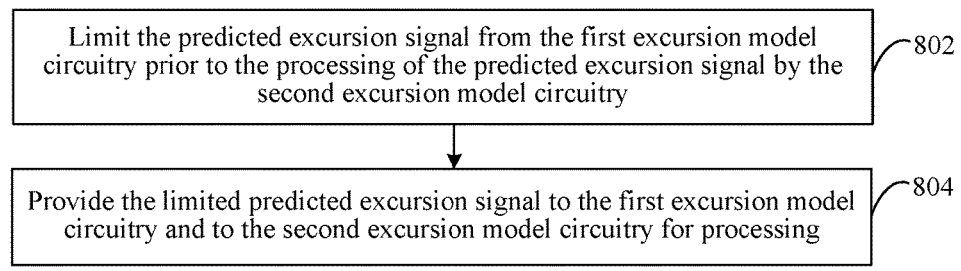
FIG. 8 shows a flowchart for excursion-constraining processing and limiting by the excursion-constraining processing circuitry of FIG. 6, according to an example embodiment.

Referring also to FIG. 8, a flowchart 800 for excursion-constraining processing and limiting by excursion-constraining processing circuitry 600 of FIG. 6 is shown, according to an embodiment. That is, excursion-constraining processing circuitry 600, along with its subcomponents such as limiter 606, may be configured to perform their respective functions in accordance with flowchart 800. Flowchart 800 may be performed as a portion of (706) of flowchart 700, according to embodiments. Flowchart 800 is described as follows.

The predicted excursion signal from the first excursion model circuitry is limited prior to the processing of the predicted excursion signal by the second excursion model circuitry (802). For example, limiter 606 of excursion-constraining processing circuitry 600 (which comprises a non-linear constraint filter) is configured to receive the processed output signal from summer 632, i.e., a predicted excursion signal generated from an audio signal that has been processed according to the excursion model by excursion model circuitry 602. Limiter 606 limits the predicted excursion signal to generate a limited predicted excursion signal.

The limited predicted excursion signal is provided to the first excursion model circuitry and to the second excursion model circuitry for processing (804). For instance, the output of limiter 606, i.e., the limited predicted excursion signal, is provided to sample signal delay component 640 of excursion model circuitry 602, and to inverse excursion model circuitry 604, as described in additional detail below, for further respective processing.

As noted above, inversion of the excursion model by inverse excursion model circuitry 604 may necessitate stabilization due to triple zero of inverse excursion model at $Z=-1$. In such cases, the inverse excursion model may be modified by the stabilization factor $\gamma$ as:

$$\frac{U(z)}{X(z)} = \frac{\frac{1}{b_0} + \frac{a_1}{b_0}z^{-1} + \frac{a_2}{b_0}z^{-2} + \frac{a_3}{b_0}z^{-3}}{\left(1 + (z/\gamma)^{-1}\right)^3}, \quad \text{(Eq. 52)}$$

which corresponds to inverse excursion model circuitry 604.

Figure 9:
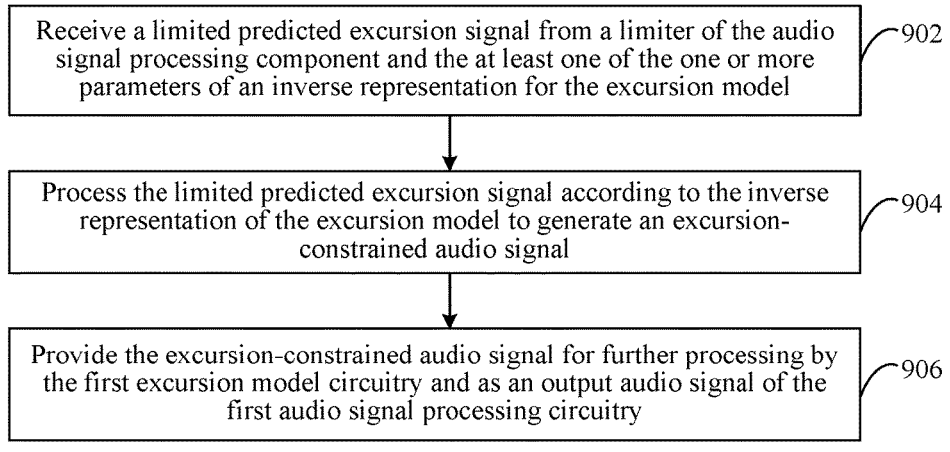
FIG. 9 shows a flowchart for excursion-constraining processing by the excursion-constraining processing circuitry of FIG. 6, according to an example embodiment.

Referring also to FIG. 9, a flowchart 900 for excursion-constraining processing by excursion-constraining processing circuitry 600 of FIG. 6 is shown, according to an embodiment. That is, excursion-constraining processing circuitry 600, along with its subcomponents such as inverse excursion model circuitry 604, may be configured to perform their respective functions in accordance with flowchart 900. Flowchart 900 may be performed subsequent to (804) of flowchart 800, according to embodiments. Flowchart 900 is described as follows.

The limited predicted excursion signal is received from a limiter of the audio signal processing component and the at least one of the one or more parameters for an inverse representation of the excursion model (902). For instance, inverse excursion model circuitry 604 is configured to receive the limited predicted excursion signal that is output in (804) and to receive the parameters for the excursion model as in (702) but that has been inverted according to inverse excursion model circuitry 604. That is, in embodiments, inverse excursion model circuitry 604 is configured to receive the limited predicted excursion signal subsequent to limiting by limiter 606, as in flowchart 800, as well as inverted impedance model representation parameters.

The limited predicted excursion signal is processed according to an inverse representation of the excursion model to generate an excursion-constrained audio signal (904). For example, inverse excursion model circuitry 604 of excursion-constraining processing circuitry 600 (which comprises a non-linear constraint filter) is configured to process the limited predicted excursion signal according to an inverse representation of the excursion model to generate an excursion-constrained audio signal.

Inverse excursion model circuitry 604 includes a second plurality of summers: a summer 656, a summer 658, a summer 660, a summer 662, a summer 664, and a summer 668; and a second plurality of multipliers: a multiplier 642, a multiplier 644, a multiplier 646, a multiplier 648, a multiplier 650, a multiplier 652, and a multiplier 654. Multiplier 642, multiplier 644, multiplier 646, multiplier 648, multiplier 650, multiplier 652, and multiplier 654 are each configured to generate a product of their respective inputs. Summer 656, summer 658, summer 660, summer 662, summer 664, and summer 668, are each configured to add their inputs together.

With respect to the second plurality of connectors for inverse excursion model circuitry 604: a connector 684 is configured to provide an eighth parameter "$3\gamma$" received by multiplier 642, a connector 686 is configured to provide a ninth parameter "$3\gamma^2$" received by multiplier 644, a connector 688 is configured to provide a tenth parameter "$\gamma^3$" received by multiplier 646, a connector 690 is configured to provide an eleventh parameter "$1/b_0$" received by multiplier 648, a connector 692 is configured to provide a twelfth parameter "$a_1/b_0$" received by multiplier 650, a connector 694 is configured to provide a thirteenth parameter "$a_2/b_0$" received by multiplier 652, and a connector 696 is configured to provide a fourteenth parameter "$a_3/b_0$" received by multiplier 654, as shown in FIG. 6.

Summer 658 receives the product of the eighth parameter and a one unit delayed representation of excursion-constrained audio signal $u_{out}(n)$, via sample signal delay component 634, from multiplier 642. Summer 656 receives the product of the ninth parameter and a two unit delayed representation of excursion-constrained audio signal $u_{out}(n)$, via sample signal delay component 636 which receives the output of sample signal delay component 634, from multiplier 644. Summer 656 also receives the product of the tenth parameter and a three unit delayed representation of excursion-constrained audio signal $u_{out}(n)$, via sample signal delay component 638 which receives the output of sample signal delay component 636, from multiplier 646. The sum output by summer 656 is provided to summer 658, and the sum output by summer 658 is provided to summer 668.

The product of the limited predicted excursion signal (output by limiter 606) and the eleventh parameter is provided to summer 660 from multiplier 648. Summer 660 also receives the product of the twelfth parameter and a one unit delayed representation of the limited predicted excursion signal, via sample signal delay component 640, from multiplier 650. Summer 662 receives the product of the thirteenth parameter and a two unit delayed representation of the limited predicted excursion signal, via sample signal delay component 642 which receives the output of sample signal delay component 640, from multiplier 652. Summer 662 also receives the sum output by summer 660. Summer 664 receives the product of the fourteenth parameter and a three unit delayed representation of the limited predicted excursion signal, via sample signal delay component 644 which receives the output of sample signal delay component 642, from multiplier 654. The sum output by summer 664 is provided to summer 668.

The excursion-constrained audio signal is provided for further processing by the first excursion model circuitry and as an output audio signal of the first audio signal processing circuitry (906). The sum output by summer 668 is provided to sample signal delay component 634 of excursion model circuitry 602 and as the excursion-constrained audio signal $u_{out}(n)$ on output connector 699 of inverse excursion model circuitry 604 of excursion-constraining processing circuitry 600. As noted above, the provision of the excursion-constrained audio signal $u_{out}(n)$ to excursion model circuitry 602 via output connector 699 is a non-linear function of excursion-constraining processing circuitry 600.

The described sample signal delay components, summers, and/or multipliers of inverse excursion model circuitry 604 may be implemented in embodiments using a variety of circuits, electrical components, programmable logic devices, integrated circuits, and/or the like, in some embodiments such as but without limitation, using firmware and/or software, using digital hardware such as a DSP or an ASIC, etc.

In embodiments, the elements of excursion-constraining processing circuitry 600 may be connected as shown by connectors such as, but not limited to, circuit board traces, intra-circuit connectors and/or traces, vias, direct element connections, other conductive elements, etc., and also may be implemented as connectors in a device such as an integrated circuit, an ASIC, a DSP, etc.

While exemplary inputs, connectors, and components (e.g., circuit components) are shown in FIG. 6 as an illustrative embodiment, it is contemplated herein that other equivalent and/or alternate inputs, connectors, and components may be included, and that not all shown must be included, in some embodiments. Likewise, the illustrated embodiment may be utilized and/or organized in equivalent and/or alternate configurations, in some embodiments (e.g., one or more elements of excursion model circuitry 602 and/or one or more elements of inverse excursion model circuitry 604 (for example, but without limitation, the sample signal delay components described herein) may be included, grouped, etc., in other portions of excursion-constraining processing circuitry 600).

According to the described techniques and embodiments, the gain change parameter and the excursion model, along with its associated parameters, may be updated at any rate, and may be updated independently of audio processing circuitry (i.e., asynchronously). The audio processing circuitry described herein is configured to process audio signals at a rate such that a processed audio frame is provided as output to be played back by a loudspeaker for every audio frame input received. For example, the downstream processing components described herein may process an audio frame approximately every 10 ms (i.e., the frame-rate). However, while the downstream model estimation components may update the gain change parameter and the excursion model (and parameters) at a similar rate, in embodiments the updating for the gain change parameter and the excursion model may be performed at a slower rate than the frame-rate that provides a balance between robust loudspeaker protection, power usage, and system complexity.

Additionally, because the downstream processing components process the audio signals and the upstream loudspeaker model estimation components do not process the audio signals, according to embodiments, the updating rate of the upstream loudspeaker model estimation components is not required to be as fast as the downstream processing components, e.g., for temperature prediction and gain change parameter generation based on a relatively slowly changing temperature for loudspeakers and voice coils in devices. It is contemplated in embodiments, however, that the conversion/generation and updating for excursion models may be performed at a rate that is different than that for the temperature prediction and gain change parameter, both less than or equal to the operating rate for processing audio signals by the downstream processing components.

Figure 10:
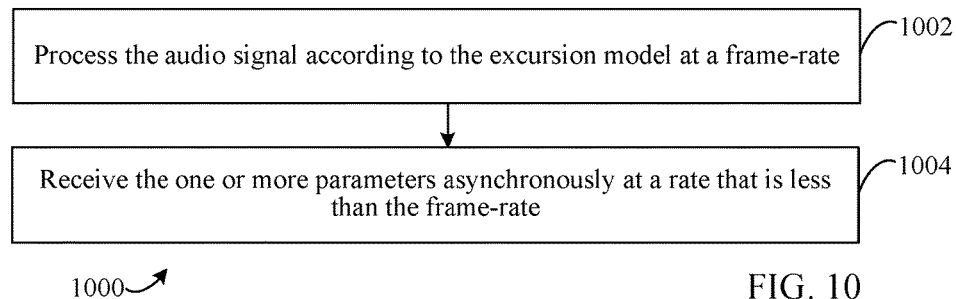
FIG. 10 shows a flowchart for audio signal processing and receiving excursion model parameters, according to an example embodiment.

In FIG. 10, a flowchart 1000 for audio signal processing and receiving excursion model parameters by downstream audio signal processing component 400 of FIG. 4 and/or excursion-constraining processing circuitry 600 of FIG. 6 is shown, according to an embodiment. That is, downstream audio signal processing component 400 and/or excursion-constraining processing circuitry 600, along with their respective subcomponents, may be configured to perform their respective functions in accordance with flowchart 1000. Flowchart 1000 is described as follows.

The audio signal is processed according to the excursion model at a frame-rate (1002). For instance, portions of audio signal processing component 400 and/or excursion-constraining processing circuitry 600, and their respective subcomponents, may be configured to process audio signals at a given frame rate. The frame rate may be any rate used for processing audio signals for real time playback of audio signals (e.g., at or about 10 ms per frame), or approximately real time processing, although frame rates that are increased or decreased from real time are contemplated, and real time are also contemplated. For example, when receiving an audio signal at a given frame rate for playback by a loudspeaker, the processing of the audio signal may be performed at a rate that is at least the given frame rate.

Likewise, audio signals may be sampled for processing at a sampling rate that corresponds to the type of audio signal (e.g., music audio, speech received by a microphone, voice of internet protocol (VOIP), other telephony signals, audio signals from files or other tangible media, audio accompanying multimedia or video (e.g., movies), commercial digital/audio recordings, etc.), as would be understood by one of skill in the relevant art(s) having the benefit of this disclosure. In one embodiment, a sampling rate of, or approximately of, 44.1 kHz may be used, although other rates are contemplated herein as noted.

The one or more parameters are received asynchronously at a rate that is less than the frame-rate (1004). For instance, downstream audio signal processing component 400 of FIG. 4 and/or excursion-constraining processing circuitry 600 of FIG. 6 are configured to receive one or more parameters of an excursion model (e.g., as in (504) and/or (702), and as described herein. The one or more parameters may be received from a model estimation component such as impedance to excursion model converter 204 of FIG. 2, as described above. The one or more parameters may be provided to downstream audio signal processing component 400 and/or excursion-constraining processing circuitry 600 (e.g., to excursion model circuitry 602 and inverse excursion model circuitry 604) at a rate that is less than or equal to the frame rate of the audio signal and/or asynchronous to the processing frame rate in (1002) such as a rate that does not align with the audio signal frames or a specific portion of the audio signal (e.g., is independent of the audio frames), in embodiments, although it is contemplated that the one or more parameters may be received at a rate that is higher than the frame rate of the audio signal.

V. Further Example Embodiments and Advantages

As noted above, systems and devices may be configured in various ways to perform methods for loudspeaker protection according to the techniques and embodiments provided. For instance, in embodiments, upstream loudspeaker model estimation components are configured to receive sensed electrical characteristics of a loudspeaker and generate an impedance model from which an excursion model of the loudspeaker and a gain change parameter may be generated. Downstream processing components may subsequently utilize the gain change parameter and the excursion model (or parameters thereof) to constrain the temperature of a voice coil of the loudspeaker and to limit an excursion of the loudspeaker. Downstream processing components may also utilize processed signals associated with the constrained temperature and the limited excursion to suppress distortion for an output audio signal to be played back by the loudspeaker.

Electrical observations in the form of measurement of the voice coil current and voltage allow for estimation of the electrical counterparts of the mechanical loudspeaker parameters, but does not allow unique estimation of the mechanical loudspeaker parameters. Determining the voice coil voltage to cone excursion transfer function, and hence predicting the cone excursion from the voice coil voltage, requires the mechanical loudspeaker parameters, or at the very least, the force factor in addition to the electrical parameters. Possible approximations of the force factor by using the worst case value (e.g., based on manufacturing tolerance) in terms of reaching highest cone excursion may be applied. Operating such that the worst case cone excursion obeys the maximum cone excursion may provide operation within a safe range, albeit more conservative in general than may be necessary. Embodiments provide for estimating the force factor by an additional measurement(s) (e.g., beyond the voice coil current and voltage) is described below. The challenge is to find a nonintrusive approach as the estimation must be carried out "on the fly" with the real device and without the ability to attach weight to the loudspeaker cone, add an enclosure of known volume, or, due to cost, include a laser or a secondary coil in the loudspeaker design.

The additional measurement mentioned above is a measure of the sound pressure which in comparison to a prediction of the sound pressure may provide a path to estimate the force factor, according to embodiments. There are, however, practical issues to overcome, e.g., that the sound pressure is affected by the environment such as a room and a practical way to measure the sound pressure must be devised. The effect of the environment can be minimized by measuring the sound pressure close to the loudspeaker so that the direct path dominates any reflections, and measurement of the sound pressure can be carried out by exploiting the microphone likely already present on a device. This may require compensation for any transfer functions due to the acoustic design of the device, which however, is fixed and hence can be known from the design of the device.

The described embodiments may be configured to use properties of only the measured magnitude impedance (i.e., from the sensed voice coil current and voltage signals) to fit the individual components of the impedance model. This results in a robust, accurate, and low complexity method that is insensitive to the phase of the current and voltage sense signals. That is, such a method uses only the magnitude of the current and voltage magnitude spectra to estimate the magnitude spectrum of the impedance. Additionally, this method converges quickly and is not subject to typical convergence issues of adaptive filters. The disclosed embodiments and processing to constrain diaphragm or cone displacement (i.e., excursions) is effectively a unique non-linear filter, that is highly effective in combination with a distortion suppression method to constrain the diaphragm displacement, minimize distortion to the signal, and yet maintain good loudness of the played-back audio signal.

Furthermore, the techniques and embodiments herein cover more than just the basic properties of the physical system made up of the loudspeaker—rather the described techniques and embodiments are capable of modeling unique features of device loudspeakers, such as microspeakers, mounted in devices. For instance, device loudspeakers may produce an impedance with two resonances (e.g., a primary resonance and a secondary resonance). The present techniques and embodiments are capable of modeling both the primary and the secondary resonance of such loudspeakers.

In embodiments, one or more of the operations of any flowchart described herein may not be performed. Moreover, operations in addition to or in lieu of any flowchart described herein may be performed. Further, in embodiments, one or more operations of any flowchart described herein may be performed out of order, in an alternate sequence, or partially (or completely) concurrently with each other or with other operations.

A "connector," as used herein, may refer to a hardware connection or a software connection for the transfer of data, instructions, and/or information, according to embodiments The further example embodiments and advantages described in this Section may be applicable to embodiments disclosed in any other Section of this disclosure.

Embodiments and techniques, including methods, described herein may be performed in various ways such as, but not limited to, being implemented in hardware, or hardware combined with one or both of software and firmware. For example, embodiments may be implemented in systems and devices, as well as specifically customized hardware, application specific integrated circuits (ASICs), field programmable gate arrays (FPGAs) digital signal processors (DSPs), etc., electrical circuitry, and/or the like.

VI. Example Computer Implementations

Loudspeaker protection system 100A of FIG. 1A, device 100B of FIG. 1B, microspeaker 100C of FIG. 1C, upstream loudspeaker model estimation component 200 of FIG. 2, downstream audio signal processing component 400 of FIG. 4, and/or excursion-constraining processing circuitry 600 of FIG. 6, along with any respective components/subcomponents thereof, and/or any flowcharts, further systems, sub-systems, and/or components disclosed herein may be implemented in hardware (e.g., hardware logic/electrical circuitry), or any combination of hardware with one or both of software (computer program code or instructions configured to be executed in one or more processors or processing devices) and firmware.

Figure 11:
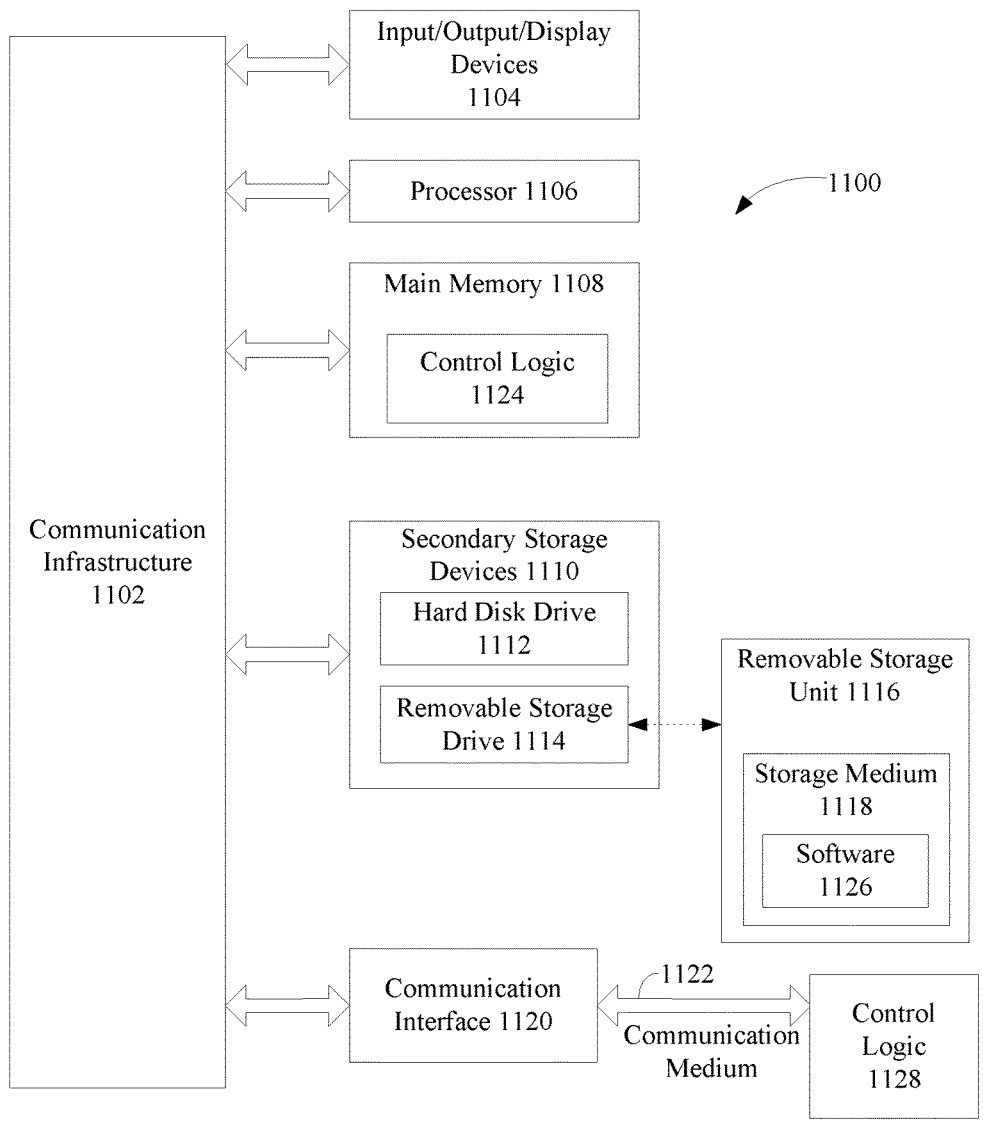
FIG. 11 shows a block diagram of a computing device/system in which the techniques disclosed herein may be performed and the example embodiments herein may be utilized.

The embodiments described herein, including circuitry, devices, systems, methods/processes, and/or apparatuses, may be implemented in or using well known processing devices, communication systems, servers, and/or, computers, such as a processing device 1100 shown in FIG. 11. It should be noted that processing device 1100 may represent communication devices/systems (e.g., device 100B), entertainment systems/devices, processing devices, and/or traditional computers in one or more embodiments. For example, loudspeaker protection systems and devices, and any of the sub-systems and/or components respectively contained therein and/or associated therewith, may be implemented in or using one or more processing devices 1100 and similar computing devices.

Processing device 1100 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1100 may be any type of computer, including a desktop computer, a server, etc., and may be a computing device or system within another device or system.

Processing device 1100 includes one or more processors (also called central processing units, or CPUs), such as a processor 1106. Processor 1106 is connected to a communication infrastructure 1102, such as a communication bus. In some embodiments, processor 1106 can simultaneously operate multiple computing threads, and in some embodiments, processor 1106 may comprise one or more processors.

Processing device 1100 also includes a primary or main memory 1108, such as random access memory (RAM). Main memory 1108 has stored therein control logic 1124 (computer software), and data.

Processing device 1100 also includes one or more secondary storage devices 1110. Secondary storage devices 1110 include, for example, a hard disk drive 1112 and/or a removable storage device or drive 1114, as well as other types of storage devices, such as memory cards and memory sticks. For instance, processing device 1100 may include an industry standard interface, such a universal serial bus (USB) interface for interfacing with devices such as a memory stick. Removable storage drive 1114 represents a floppy disk drive, a magnetic tape drive, a compact disk drive, an optical storage device, tape backup, etc.

Removable storage drive 1114 interacts with a removable storage unit 1116. Removable storage unit 1116 includes a computer useable or readable storage medium 1118 having stored therein computer software 1126 (control logic) and/or data. Removable storage unit 1116 represents a floppy disk, magnetic tape, compact disk, DVD, optical storage disk, or any other computer data storage device. Removable storage drive 1114 reads from and/or writes to removable storage unit 1116 in a well-known manner.

Processing device 1100 also includes input/output/display devices 1104, such as touchscreens, LED and LCD displays, monitors, keyboards, pointing devices, etc.

Processing device 1100 further includes a communication or network interface 1120. Communication interface 1120 enables processing device 1100 to communicate with remote devices. For example, communication interface 1120 allows processing device 1100 to communicate over communication networks or mediums 1122 (representing a form of a computer useable or readable medium), such as LANs, WANs, the Internet, etc. Network interface 1120 may interface with remote sites or networks via wired or wireless connections.

Control logic 1128 may be transmitted to and from processing device 1100 via the communication medium 1122.

Any apparatus or manufacture comprising a computer useable or readable medium having control logic (software) stored therein is referred to herein as a computer program product or program storage device. This includes, but is not limited to, processing device 1100, main memory 1108, secondary storage devices 1110, and removable storage unit 1116. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media and propagating signals (do not include communication media and propagating signals). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 11) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1106 of FIG. 11), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VII. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A loudspeaker protection system comprising an audio signal processing component that includes:
   first audio signal processing circuitry comprising a non-linear constraint filter that is configured to:
      receive an audio signal;
      receive one or more parameters of an excursion model of a loudspeaker from a model estimation component; and
      generate a processed version of the audio signal corresponding to a constrained predicted excursion based on the one or more parameters of the excursion model; and
   second audio signal processing circuitry configured to apply a gain change parameter to the audio signal prior the audio signal being received by the first audio signal processing circuitry, the gain change parameter being based on a temperature of a component of the loudspeaker.

2. The loudspeaker protection system of claim 1, wherein the first audio signal processing circuitry includes first excursion model circuitry and second excursion model circuitry;
   the first excursion model circuitry configured to:
      receive the audio signal and at least one of the one or more parameters of the excursion model, process the audio signal according to the excursion model to generate a predicted excursion signal, and
provide the predicted excursion signal for further processing by the audio signal processing component;
the second excursion model circuitry configured to:
receive a limited predicted excursion signal from a limiter of the audio signal processing component and the at least one of the one or more parameters for an inverse representation of the excursion model,
process the limited predicted excursion signal according to the inverse representation of the excursion model to generate an excursion-constrained audio signal, and
provide the excursion-constrained audio signal for further processing by the first excursion model circuitry and as an output audio signal of the first audio signal processing circuitry.

3. The loudspeaker protection system of claim 2, wherein the first audio signal processing circuitry further includes the limiter, the limiter configured to:
limit the predicted excursion signal from the first excursion model circuitry prior to the processing of the limited predicted excursion signal by the second excursion model circuitry; and
provide the limited predicted excursion signal to the first excursion model circuitry and to the second excursion model circuitry for processing.

4. The loudspeaker protection system of claim 3, wherein the first excursion model circuitry is further configured to:
use each of the at least one of the one or more parameters of the excursion model to generate a predicted excursion; and
provide the predicted excursion signal to the limiter for processing.

5. The loudspeaker protection system of claim 4, wherein the second excursion model circuitry is further configured to:
use each of the at least one of the one or more parameters for the inverse representation of the excursion model to generate the processed version of the audio signal corresponding to the constrained predicted excursion; and
provide the processed version of the audio signal to the first excursion model circuitry for processing, and as an output of the audio signal processing component.

6. The loudspeaker protection system of claim 1, wherein less than all of the one or more parameters of the excursion model are used to generate the processed version of the audio signal.

7. The loudspeaker protection system of claim 1, wherein the component of the loudspeaker is a voice coil of the loudspeaker.

8. The loudspeaker protection system of claim 1, wherein the loudspeaker is a microspeaker.

9. A method in a loudspeaker protection system comprising:
receiving an audio signal by first audio signal processing circuitry comprising a non-linear constraint filter;
receiving one or more parameters of an excursion model of a loudspeaker by the first audio signal processing circuitry from a model estimation component;
generating a processed version of the audio signal corresponding to a constrained predicted excursion based on the one or more parameters of the excursion model by the first audio signal processing circuitry; and
applying a gain change parameter to the audio signal by second audio signal processing circuitry prior to receiving the audio signal by the first audio signal processing circuitry, the gain change parameter being based on a temperature of a component of the loudspeaker.

10. The method of claim 9, further comprising:
performing by first excursion model circuitry of the first audio signal processing circuitry:
receiving the audio signal and at least one of the one or more parameters of the excursion model,
processing the audio signal according to the excursion model to generate a predicted excursion audio signal, and
providing the predicted excursion signal for further processing by the first audio signal processing circuitry; and
performing by second excursion model circuitry of the first audio signal processing circuitry:
receiving a limited predicted excursion signal from a limiter of the first audio signal processing circuitry and the at least one of the one or more parameters for an inverse representation of the excursion model,
processing the limited predicted excursion signal according to an inverse representation of the excursion model to generate an excursion-constrained audio signal, and
providing the excursion-constrained audio signal for further processing by the first excursion model circuitry and as an output audio signal of the first audio signal processing circuitry.

11. The method of claim 10, further comprising:
performing by the limiter of the first audio signal processing circuitry:
limiting the predicted excursion signal from the first excursion model circuitry prior to the processing of the limited predicted excursion signal by the second excursion model circuitry; and
providing the limited predicted excursion signal to the first excursion model circuitry and to the second excursion model circuitry for processing.

12. The method of claim 11, further comprising performing by the first excursion model circuitry:
use each of the at least one of the one or more parameters of the excursion model to generate a predicted excursion; and
provide the predicted excursion signal to the limiter for processing.

13. The method of claim 12, further comprising performing by the second excursion model circuitry:
using each of the at least one of the one or more parameters for the inverse representation of the excursion model to generate the processed version of the audio signal corresponding to the constrained predicted excursion; and
providing the processed version of the audio signal to the first excursion model circuitry for processing, and as an output of the first audio signal processing circuitry.

14. The method of claim 10, further comprising processing the audio signal according to the excursion model at a frame-rate; and
wherein receiving the one or more parameters of the excursion model comprises receiving the one or more parameters asynchronously at a rate that is less than the frame-rate.

15. The method of claim 9, wherein less than all of the one or more parameters of the excursion model are used to generate the processed version of the audio signal.

16. The method of claim 9, wherein the loudspeaker is a microspeaker.

17. The method of claim 16, wherein the loudspeaker protection system is included in a mobile device.

18. The method of claim 9,
wherein the component of the loudspeaker is a voice coil of the loudspeaker.

19. A computer readable storage device comprising a storage medium encoded with program instructions that, when executed by a computing device, cause the computing device to perform a method for loudspeaker protection based on processing of an audio signal, the program instructions comprising:
   first instructions for receiving an audio signal;
   second instructions for receiving one or more parameters of an excursion model of a loudspeaker from a model estimation component;
   third instructions for generating a processed version of the audio signal corresponding to a constrained predicted excursion based on the excursion model using a non-linear constraint filter; and
   fourth instructions for:
      processing the audio signal according to the excursion model to generate a predicted excursion audio signal,
      limiting the predicted excursion audio signal,
      processing the limited predicted excursion audio signal according to an inverse representation of the excursion model to generate an excursion-constrained audio signal, and
      providing the excursion-constrained audio signal for further processing according to the excursion model and as the processed version of the audio signal for playback by the loudspeaker.

20. The computer readable storage device of claim 19, wherein the loudspeaker is a microspeaker of a mobile device.

* * * * *

UNITED STATES PATENT AND TRADEMARK OFFICE
CERTIFICATE OF CORRECTION

PATENT NO. : 10,194,241 B2
APPLICATION NO. : 15/365401
DATED : January 29, 2019
INVENTOR(S) : Jes Thyssen It is certified that error appears in the above-identified patent and that said Letters Patent is hereby corrected as shown below:

In the Claims

In Column 40, Lines 56-57 replace "the audio signal prior the audio signal being received" with --the audio signal prior to the audio signal being received--.

In Column 41, Lines 66-67 replace "applying a gain change parameter to the audio signal by second audio signal processing circuitry" with --applying a gain change parameter to the audio signal by using second audio signal processing circuitry--.

Signed and Sealed this
Third Day of December, 2019

Andrei Iancu
*Director of the United States Patent and Trademark Office*